(12) United States Patent
Chandra et al.

(10) Patent No.: US 12,036,932 B2
(45) Date of Patent: Jul. 16, 2024

(54) WIRING SYSTEM ARCHITECTURE

(71) Applicant: Tesla, Inc., Austin, TX (US)

(72) Inventors: Satyan Chandra, Mountain View, CA (US); In Jae Chung, San Jose, CA (US); Adnan Esmail, Palo Alto, CA (US); Matthew Blum, San Francisco, CA (US); Rishabh Bhandari, Austin, TX (US)

(73) Assignee: Tesla, Inc., Austin, TX (US)

( * ) Notice: Subject to any disclaimer, the term of this patent is extended or adjusted under 35 U.S.C. 154(b) by 0 days.

(21) Appl. No.: 17/652,599

(22) Filed: Feb. 25, 2022

(65) Prior Publication Data
US 2022/0250562 A1 Aug. 11, 2022

Related U.S. Application Data

(63) Continuation of application No. 16/231,314, filed on Dec. 21, 2018, now Pat. No. 11,260,809.

(60) Provisional application No. 62/618,681, filed on Jan. 18, 2018.

(51) Int. Cl.
| | |
|---|---|
| *B60R 16/023* | (2006.01) |
| *B60R 16/02* | (2006.01) |
| *B60R 16/03* | (2006.01) |
| *H01R 12/62* | (2011.01) |
| *H01R 13/50* | (2006.01) |
| *H01R 25/16* | (2006.01) |

(Continued)

(52) U.S. Cl.
CPC ...... *B60R 16/0238* (2013.01); *B60R 16/0207* (2013.01); *B60R 16/03* (2013.01); *H05K 1/0216* (2013.01); *H05K 9/003* (2013.01); *H05K 9/0098* (2013.01); *H01R 12/62* (2013.01); *H01R 13/50* (2013.01); *H01R 25/162* (2013.01)

(58) Field of Classification Search
CPC . B60R 16/0238; B60R 16/0207; B60R 16/03; H05K 1/0216; H05K 9/003; H05K 9/0098; H01R 12/62; H01R 13/50; H01R 25/162
See application file for complete search history.

(56) References Cited

U.S. PATENT DOCUMENTS

| | | | |
|---|---|---|---|
| 4,710,915 | A | 12/1987 | Kitahara |
| 5,097,099 | A | 3/1992 | Miller |
| 5,342,991 | A | 8/1994 | Xu |

(Continued)

FOREIGN PATENT DOCUMENTS

| | | |
|---|---|---|
| CN | 103545633 | 1/2014 |
| EP | 0 305 058 | 3/1989 |

(Continued)

*Primary Examiner* — Carlos Amaya
(74) *Attorney, Agent, or Firm* — Knobbe, Martens, Olson & Bear, LLP

(57) ABSTRACT

A new wiring and power and communications system for an automobile that includes a plurality of devices, wherein the devices are connected to a backbone section that has an outer sheathing, a first conductor disposed within the outer sheathing, a second conductor disposed within the outer sheathing, a pair of inner sheathing members disposed within the outer sheathing and located on opposing sides of the at least one conductor, the inner sheathing members configured to electrically insulate the first conductor from the second conductor, and a shield member disposed within the outer sheathing.

19 Claims, 36 Drawing Sheets

(51) Int. Cl.
*H05K 1/02* (2006.01)
*H05K 9/00* (2006.01)

(56) References Cited

U.S. PATENT DOCUMENTS

| | | |
|---|---|---|
| 5,428,187 A | 6/1995 | Crane |
| 5,461,370 A | 10/1995 | Igarashi |
| 6,095,836 A | 8/2000 | Bolen |
| 6,126,458 A | 10/2000 | Gregory, II |
| 6,528,731 B2 | 3/2003 | Murakami |
| 6,630,624 B2 | 10/2003 | Tsao |
| 6,740,808 B1 | 5/2004 | Chang |
| 6,746,255 B1 | 6/2004 | Lee |
| 6,803,518 B2 | 10/2004 | Chang |
| 7,004,767 B2 | 2/2006 | Kim |
| 7,086,888 B2 | 8/2006 | Wu |
| 7,261,585 B2 | 8/2007 | Yamanashi |
| 9,172,149 B2 | 10/2015 | Xing |
| 9,508,467 B2 | 11/2016 | Pon |
| 9,697,926 B2 | 7/2017 | Huang |
| 9,892,820 B2 * | 2/2018 | Kodama .............. H01B 11/20 |
| 9,966,165 B2 | 5/2018 | Gross |
| 10,096,952 B1 | 10/2018 | Silver |
| 10,110,999 B1 | 10/2018 | Lim |
| 10,147,515 B2 | 12/2018 | Chin |
| 10,586,632 B2 | 3/2020 | Esmail et al. |
| 10,861,622 B2 | 12/2020 | Chung et al. |
| 10,988,092 B2 | 4/2021 | Takamatsu |
| 11,260,809 B2 | 3/2022 | Chandra et al. |
| 11,479,189 B2 | 10/2022 | Esmail et al. |
| 2002/0046870 A1 | 4/2002 | Zein |
| 2003/0121694 A1 | 7/2003 | Grogl |
| 2004/0008721 A1 | 1/2004 | Ying |
| 2008/0250632 A1 | 10/2008 | Dayton |
| 2009/0051554 A1 | 2/2009 | Jarvie |
| 2010/0149999 A1 | 6/2010 | Beattie |
| 2011/0232938 A1 | 9/2011 | Shinya |
| 2012/0049789 A1 | 3/2012 | Medina |
| 2012/0111602 A1 | 5/2012 | Wei |
| 2012/0305308 A1 * | 12/2012 | Toyama ............... H02G 3/0481 174/70 R |
| 2014/0187080 A1 | 7/2014 | Holland |
| 2015/0022376 A1 | 1/2015 | Zhang |
| 2015/0224945 A1 * | 8/2015 | Inao .................... B60R 16/0215 174/72 A |
| 2016/0351302 A1 | 12/2016 | Gundel |
| 2017/0069991 A1 | 3/2017 | Hombo |
| 2017/0080929 A1 | 3/2017 | Sawamoto |
| 2017/0207549 A1 | 7/2017 | Chang |
| 2018/0026381 A1 | 1/2018 | Haraguchi |
| 2018/0174716 A1 * | 6/2018 | Kominato ........ H01B 13/01254 |
| 2018/0301247 A1 | 10/2018 | Kobayashi |
| 2019/0043641 A1 | 2/2019 | Chen |
| 2019/0069263 A1 | 2/2019 | Ylamurto et al. |
| 2019/0174641 A1 | 6/2019 | Kato |
| 2023/0042642 A1 | 2/2023 | Esmail et al. |

FOREIGN PATENT DOCUMENTS

| | | |
|---|---|---|
| JP | 2007-109485 | 4/2007 |
| JP | 2007-324065 | 12/2007 |
| JP | 4976055 | 7/2012 |

* cited by examiner

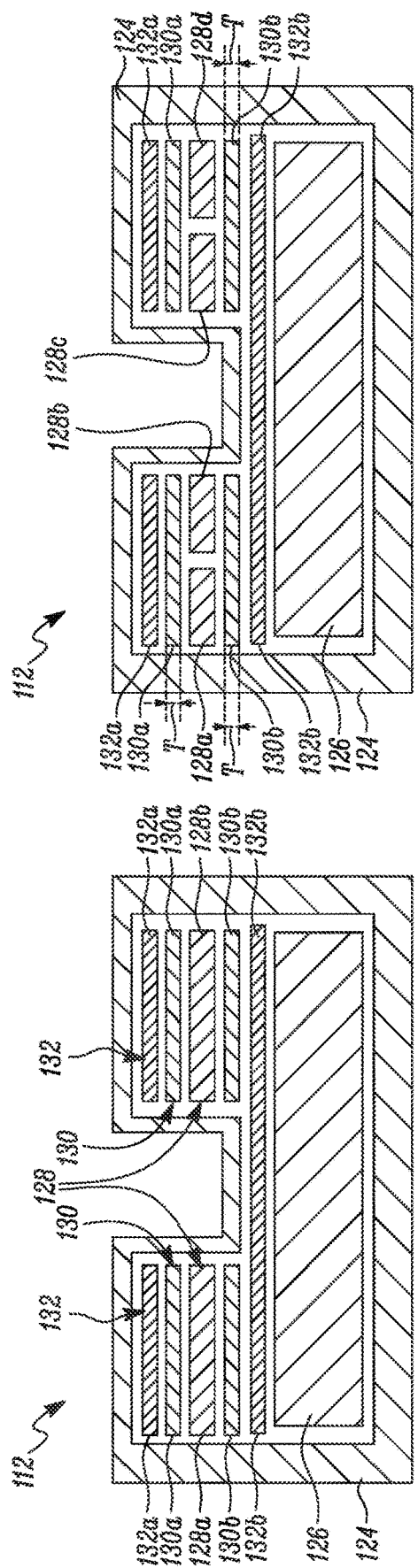
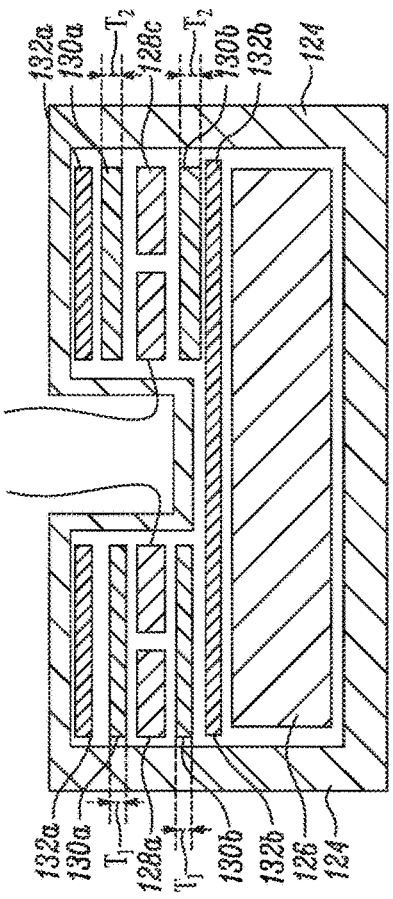
FIG. 3
FIG. 4
FIG. 5

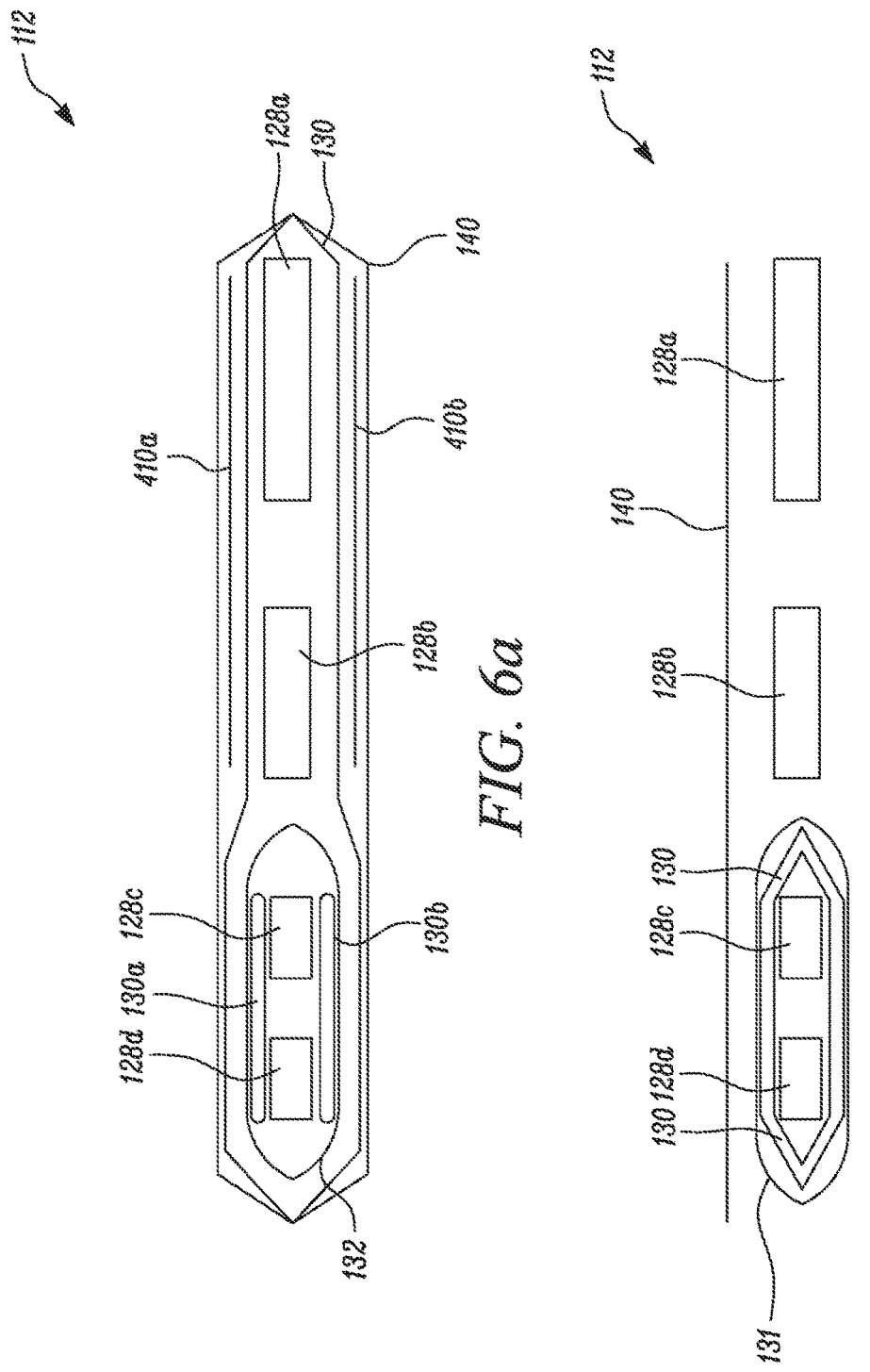

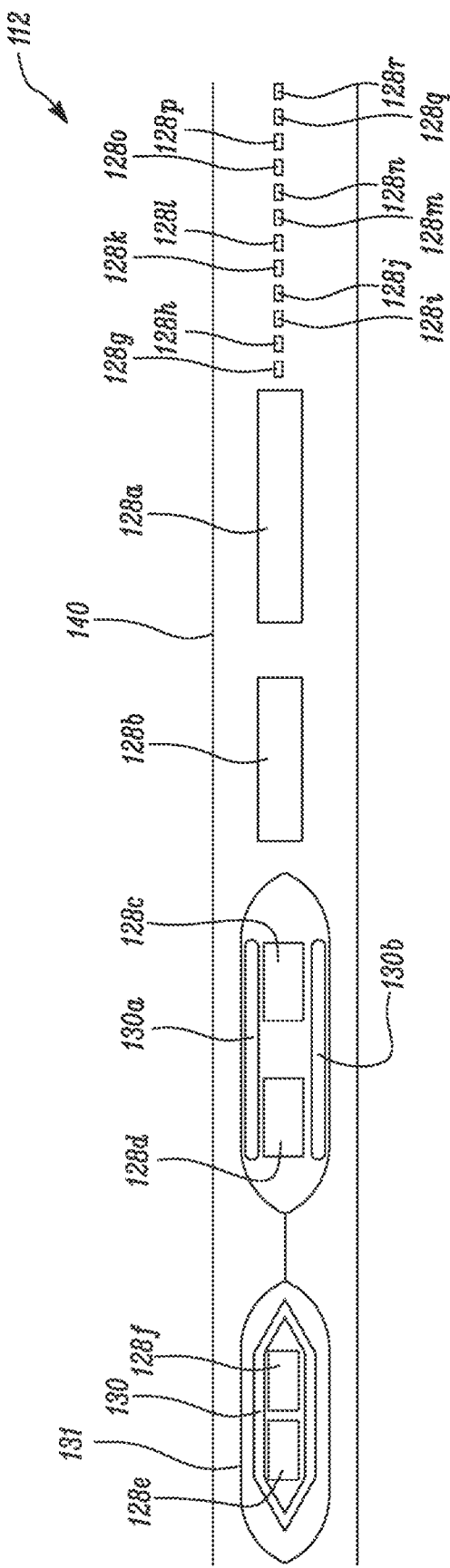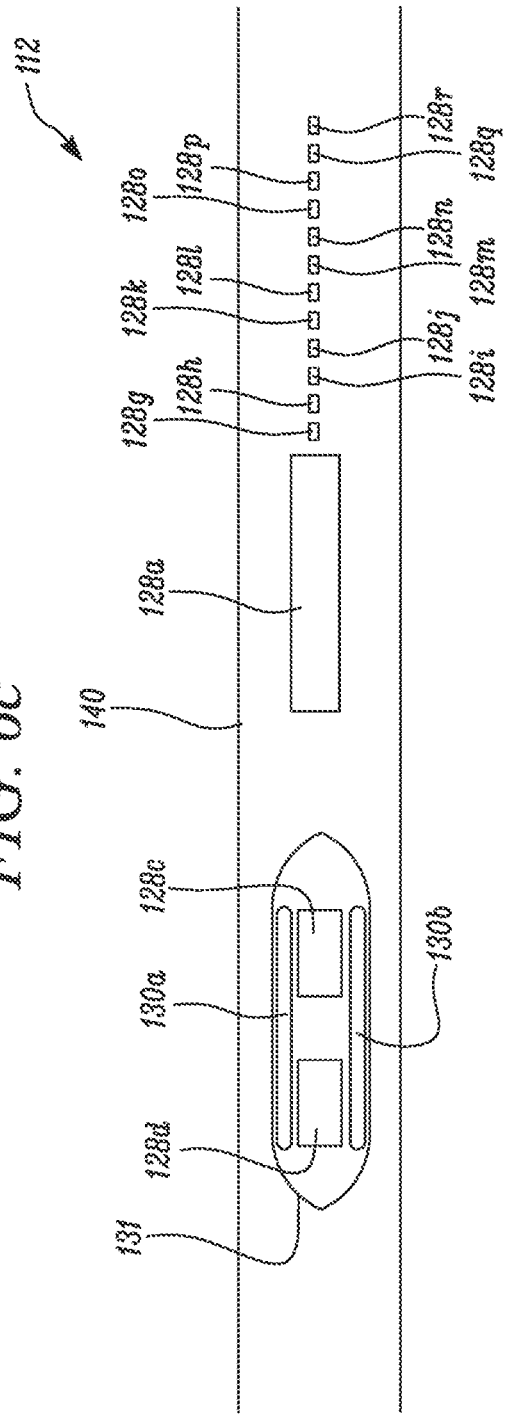

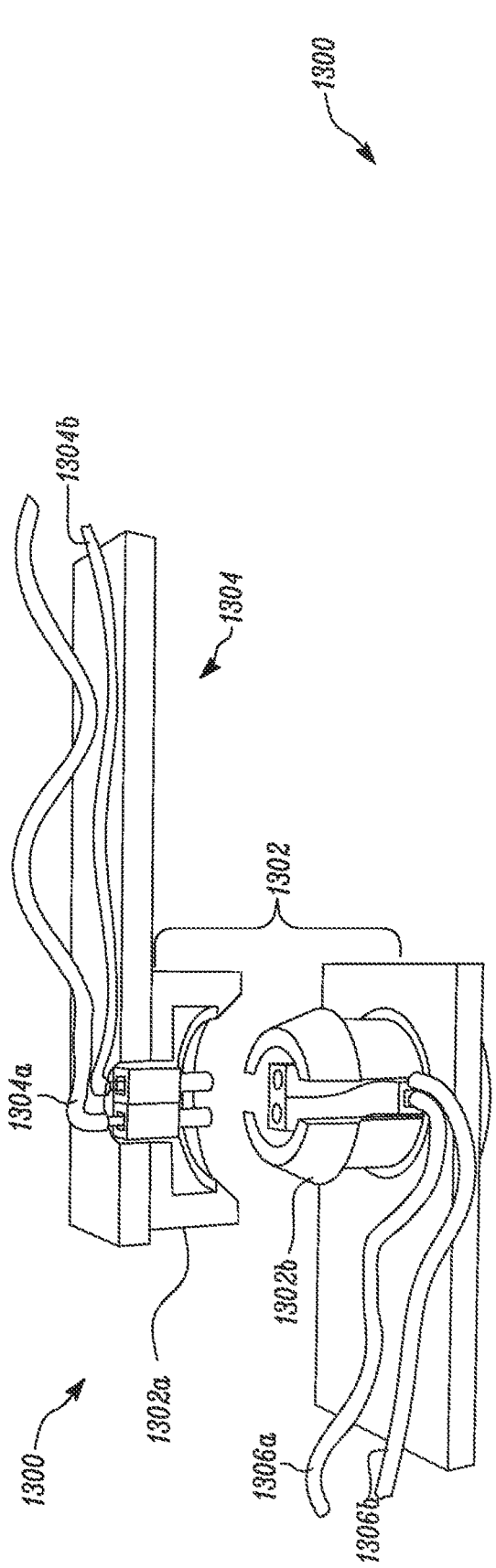
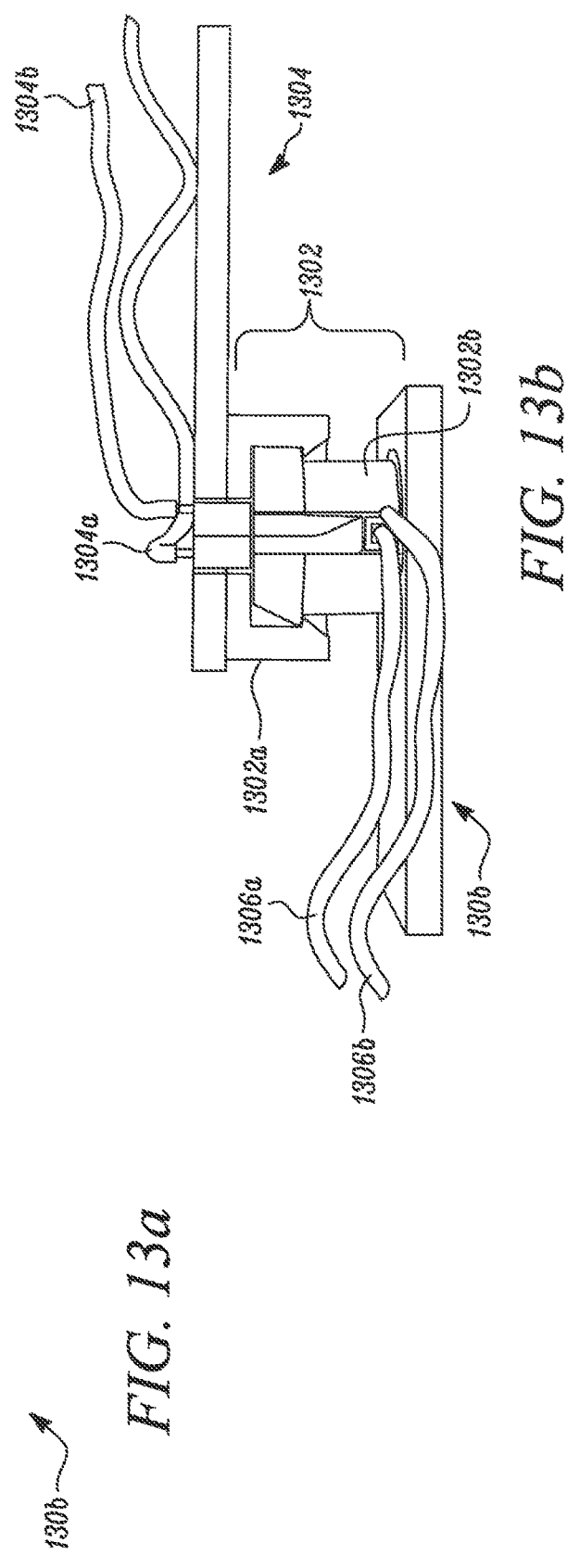
FIG. 13a
FIG. 13b

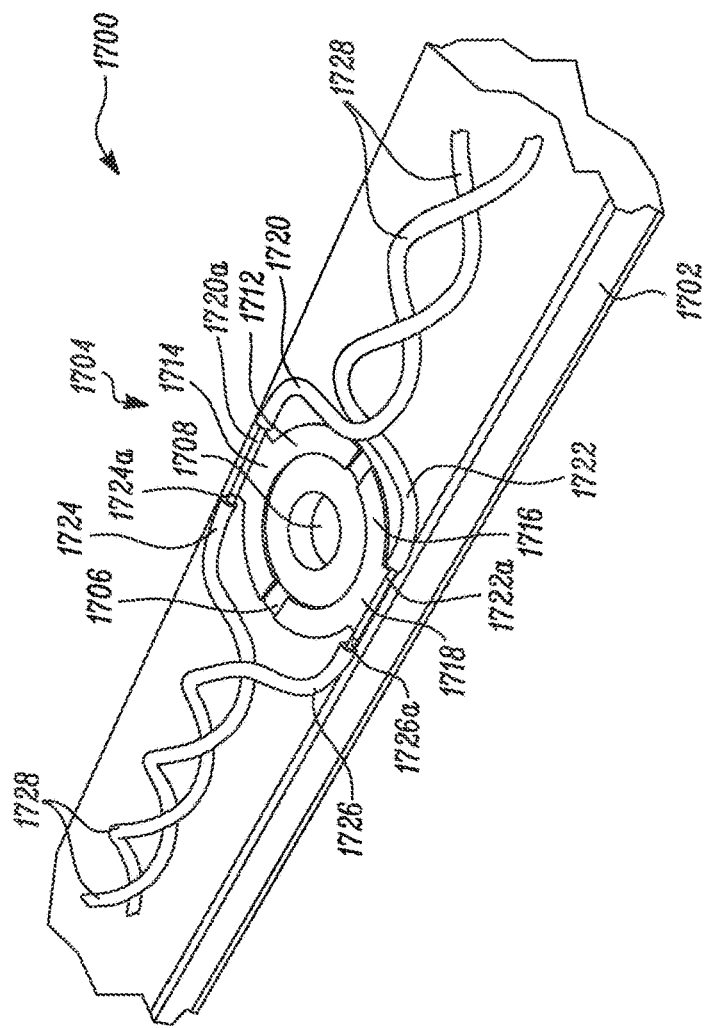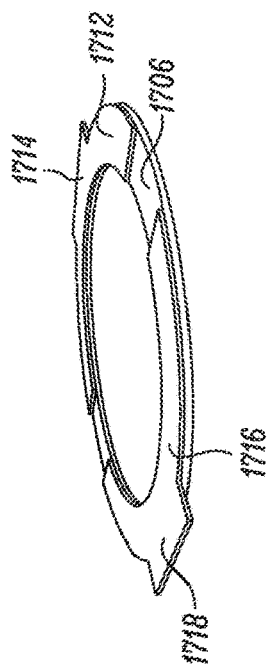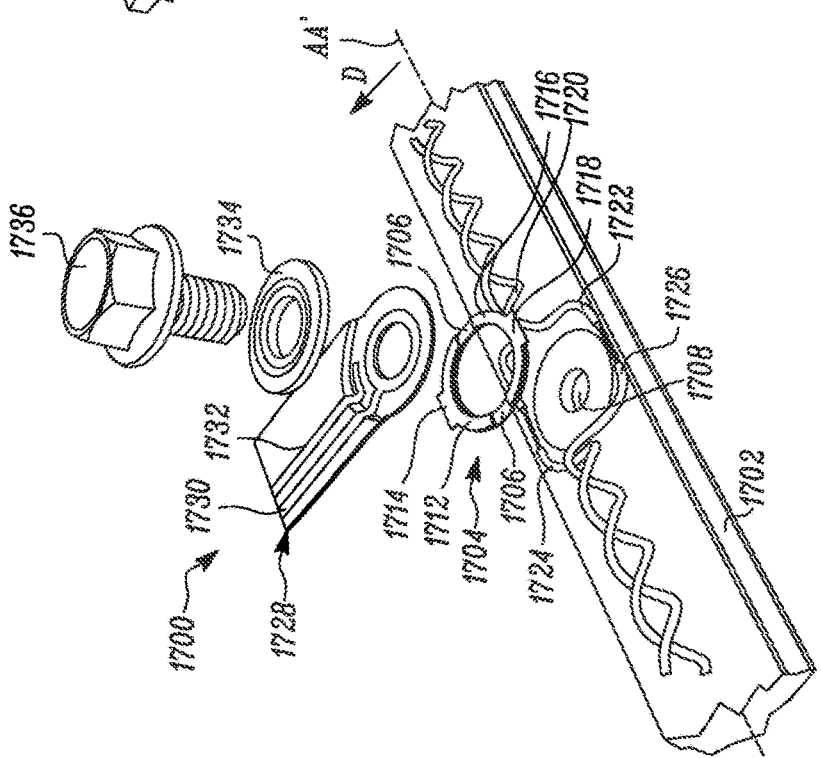

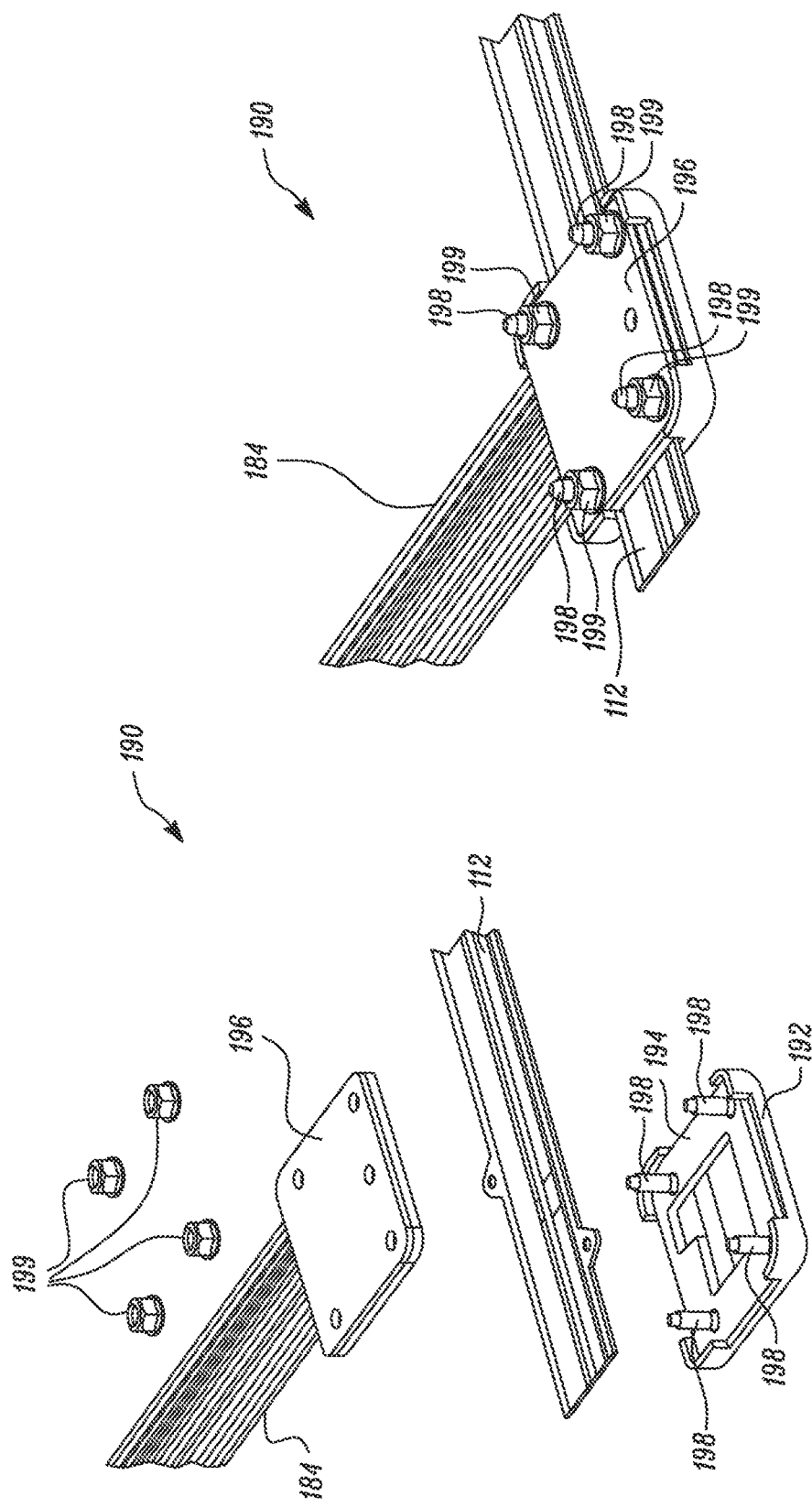

WIRING SYSTEM ARCHITECTURE

CROSS-REFERENCES TO RELATED APPLICATIONS

This application is a continuation of U.S. patent application Ser. No. 16/231,314, entitled "WIRING SYSTEM ARCHITECTURE", filed Dec. 21, 2018, which claims priority to U.S. Provisional Application No. 62/618,681, entitled "WIRING SYSTEM ARCHITECTURE", filed Jan. 18, 2018, which is hereby incorporated herein by reference in its entirety and made part of the present U.S. Utility patent application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND

Technical Field

The present disclosure relates to a new wiring and power and communications distribution system. More particularly, the present disclosure relates to a wiring system for an automobile.

Description of Related Art

Traditional car wiring for vehicles are piecemeal solutions. Typically, there are different wiring harnesses that connect each different electrical component to a central battery or power source. Each component receives power, but requires multiple wiring harnesses for communication and signals. The total length of the wire may be many miles within a single vehicle. These wiring harnesses typically consist of multiple round conductors that are not rigid. Round conductors are not optimal for transmitting current and the lack of rigidity of traditional wiring harnesses requires assembly into the vehicle using human hands, which can be a slow process. Further, connecting each component to the central battery is not optimized on an automobile level.

Hence, there is a need for wires and a wiring-system architecture that overcomes the aforementioned drawbacks.

BRIEF DESCRIPTION OF THE DRAWINGS

FIGS. 3-6e illustrate different cross-sections of the backbone section that could be implemented in the wiring system according to certain embodiments of the current invention.

FIGS. 13a-13b illustrate exploded and assembled views of an interconnect system having an adapter for connecting backbone sections according to certain embodiments of the current invention.

FIG. 17a illustrates a compound washer according to a certain other embodiment of the current invention.

FIG. 17b is an exploded view of a backbone section employing the compound washer of FIG. 17a and a flex plate, according to a certain other embodiment of the current invention.

FIG. 17c illustrates connected backbone sections using the compound washer of FIG. 17a according to a certain other embodiment of the current invention.

FIGS. 19a-d illustrate the backbone connector according to certain embodiments of the current invention.

Figure 1A:
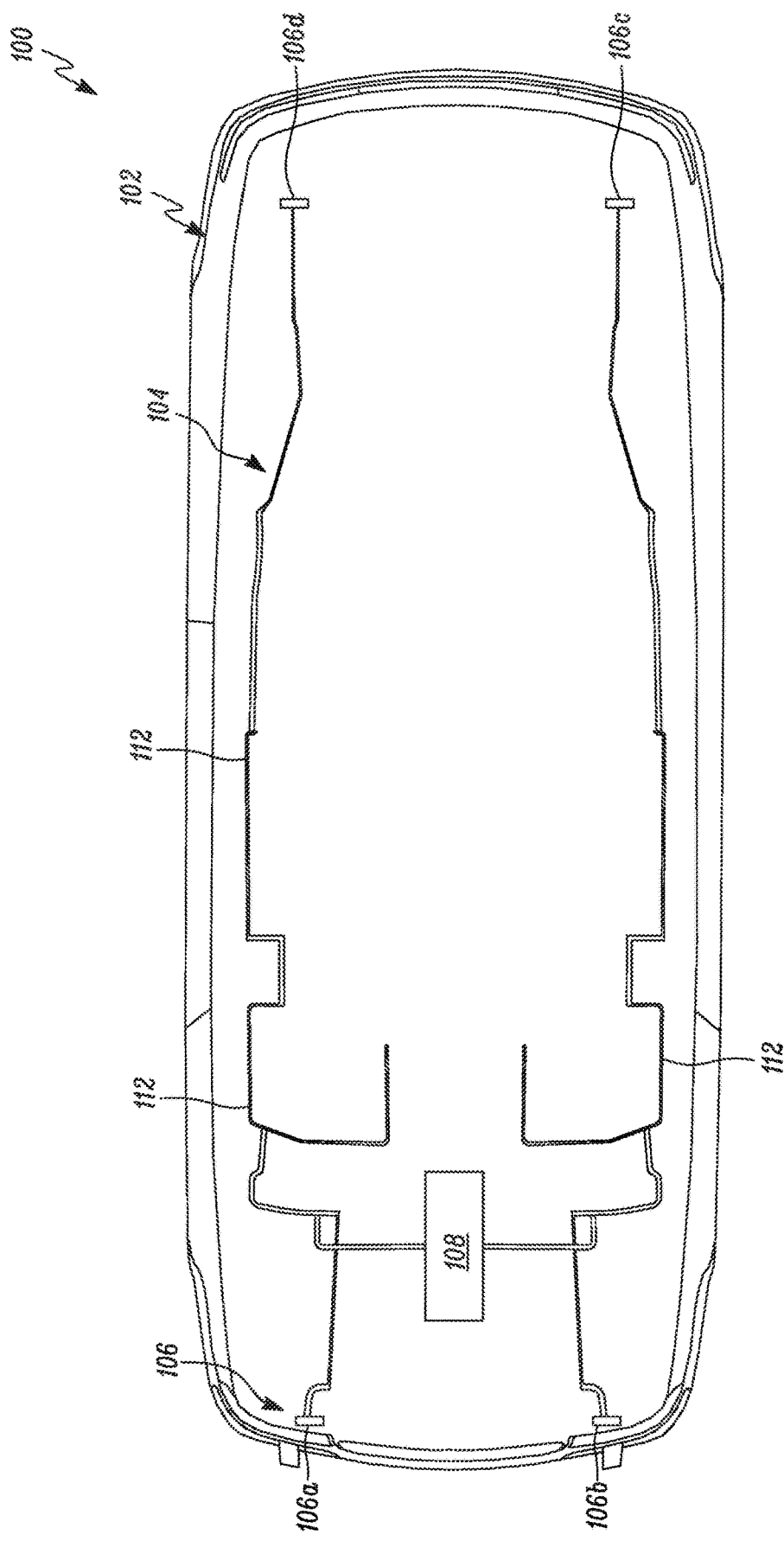
FIG. 1a illustrates a top view of an automobile showing a body and a wiring system for connecting a plurality of devices to a backbone according to certain embodiments of the current invention.

Embodiments of the present disclosure and their advantages are best understood by referring to the detailed description that follows. It should be appreciated that like reference numerals are used to identify like elements illustrated in one or more of the figures, wherein showings therein are for purposes of illustrating embodiments of the present disclosure and not for purposes of limiting the same.

DETAILED DESCRIPTION OF THE DISCLOSURE

The present disclosure relates to a wiring-system architecture and the cables and connectors necessary to implement the architecture. The overall wiring system disclosed herein approaches wiring in a different manner than traditional automotive wiring architectures. Traditional automotive wiring architectures often have many miles of cables snaking from centralized controllers and power sources to devices through the vehicle. This new architecture reduces the number and length of cables, and moves certain controllers into subassemblies which then control one or multiple devices present in the vehicle. To achieve power and signal transmission, new cables and connectors have been created and described herein.

In this new wiring architecture, subsystems are packaged and defined in one or multiple assemblies in certain embodiments. For example, a door assembly might contain one controller (or hub) that controls multiple devices, such as locking components, lighting components, audio components, etc. In addition to decreasing the number and length of wiring needed, the ability to create these subassemblies and then connect them to the wiring-architecture backbone will decrease assembly time during general assembly, which is very desirable to increase productivity in a vehicle manufacturing process. The subassembly may be created ahead of general assembly with only the connection between the door subassembly and subsystem made and verified during general assembly.

Embodiments of the present disclosure are directed at achieving the foregoing objectives.

Reference will now be made in detail to specific aspects or features, examples of which are illustrated in the accompanying drawings. Wherever possible, corresponding or similar reference numbers will be used throughout the drawings to refer to the same or corresponding parts.

Wiring Architecture

Figure 1B:
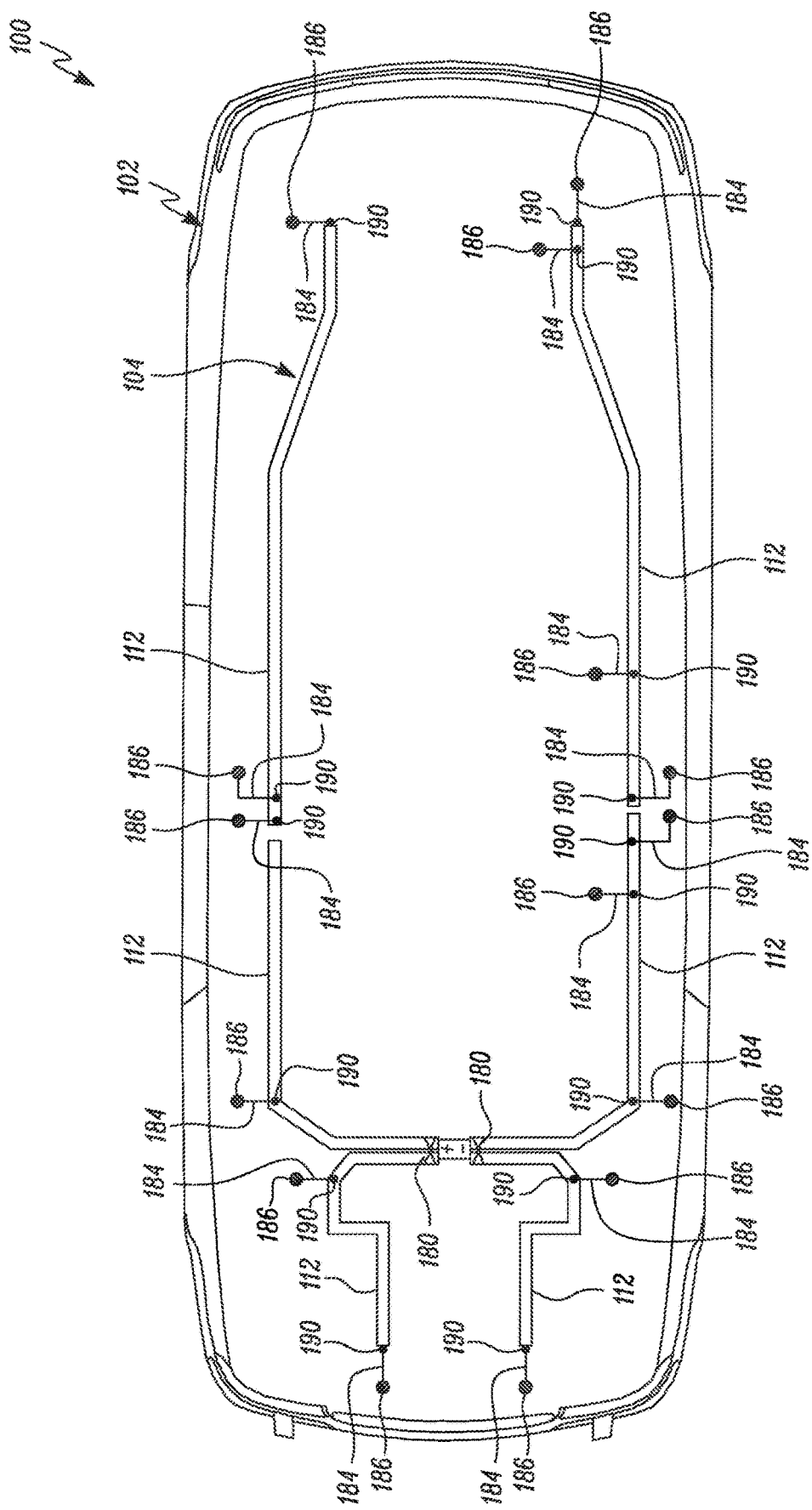
FIG. 1b illustrates a top view of an automobile showing a body and a wiring system for connecting a plurality of endpoints to a backbone according to certain embodiments of the current invention.

FIG. 1a illustrates a top view of an automobile 100 having a body 102 and a wiring system 104 for connecting a plurality of devices 106 disposed on the body 102 to a central processor 108 located within the body 102. The wiring system 104 includes a backbone 112 that is used to connect devices 106 to a central battery 180 as shown in FIG. 1b. The battery 180 may also be located elsewhere. Devices 106 may be sensors, motors, modules, actuators, or another device. These devices 106 may be directly connected to the backbone 112 as shown in FIG. 1a, or there may be intermediate connections, connectors, and/or printed circuit board assemblies in between.

Figure 2:
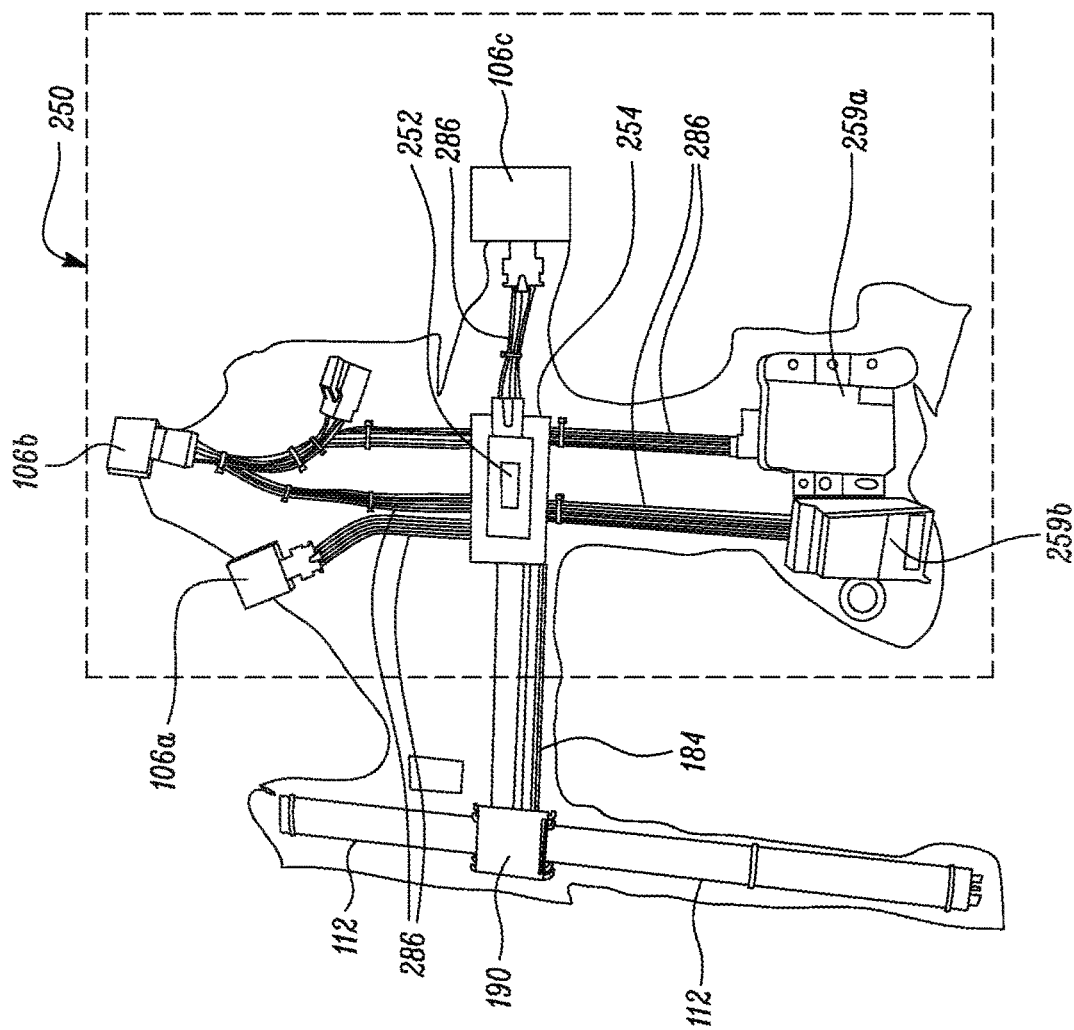
FIG. 2 illustrates a subassembly with devices connected to the backbone section via an umbilical cable according to embodiments of the present disclosure.

FIG. 1b illustrates a top view of an automobile 100 having a body 102 and a wiring system 104 for connecting a plurality of endpoints 186 disposed on or within the body 102 to a central battery 180. As shown, the wiring system 104 is formed of multiple backbone sections 112. Although multiple backbone sections 112 are depicted in the illustrated embodiment of FIG. 1b, it will be appreciated that in other embodiments of this invention, the wiring system 104 could be formed of a single backbone section 112. Wiring system 104 may also be located towards the center of the car, and may not necessarily follow the periphery or sides of the car 100 or car body 102. Backbone sections 112 are connected to battery 180. Battery 180 may be a 12V battery. In other embodiments, battery 180 may operate at a higher voltage, such as 40V or 48V or 60 V. Umbilical cables 184 are connected to a backbone section 112 via a backbone connector 190. Backbone connector 190, in different embodiments of the wiring system 104, may not be present allowing an umbilical cable 184 to be directly connected to backbone 112. Each umbilical cable 184 may be typically connected to a hub 252 containing a printed circuit board assembly (PCBA) 254, as shown in FIG. 2. In certain embodiments, the umbilical cable 184 need not necessarily be connected to a microcontroller that may reside on the PCBA 254. In fact, in certain other embodiments, the umbilical cable 184 may not even be connected to the hub 252, the PCBA 254, or the microcontroller residing on the PCBA 254, rather, the umbilical cable 184 may be directly connected to a device, for example, the device 106a, 106b, or 106c shown in FIG. 2.

PCBAs may be located within a subassembly, such as a seat, door, or other assembly that may be added or removed from the vehicle frame before, during, or after general assembly. When the umbilical cable 184 is connected to a PCBA, such as the PCBA 254, it is preferentially hot bar soldered to the PCBA, although the umbilical cable 184 may also be connected to the PCBA in other manners, such as, by means of a connector that is described later herein, by laser soldering, by traditional connectors, ultrasonic soldering, or by using conductive adhesives. The PCBA 254 is then connected to tentacle cables 286 that ultimately terminate in a device, such as the device 106a, 106b, or 106c shown in FIG. 2. Preferentially, the PCBA 254, the tentacle cables 286, and the devices 106 are packaged together to form part of an assembly, such as the subassembly 250 shown in FIG. 2. Multiple subassemblies 250 may be assembled together, as one larger subassembly, with one subassembly hosting the hub 252 as well as the PCBA 254 and remaining subassemblies having only the PCBA 254. These assemblies, or portions thereof, can be manufactured separately and then assembled into or with the vehicle frame during general assembly. In an example of a door assembly, the devices 106a, 106b, 106c could include a mirror movement actuating mechanism and/or and a door locking mechanism. If so, the mirror movement actuating mechanism and the door locking mechanism may each be connected to the PCBA, such as the PCBA 254 using tentacle cables, such as, the tentacle cables 286 shown in FIG. 2. This way, productivity can be increased during the general assembly process as manufacturers of automobiles can do away with the time-consuming processes that used to be performed earlier for accomplishing wiring in automobiles.

It may be noted that the tentacle cables 286 disclosed herein may have the same structure as the backbone section 112, or may have a different number of conductors or conductor geometry in order to appropriately connect to a device, such as the device 106*a*, 106*b*, or 106*c*, or a hub, such as the hub 252 or other hubs 259*a* or 259*b* exemplarily shown in FIG. 2. In FIG. 2, the hub 252, which includes the PCBA 254, is connected to each of the devices 106*a*, 106*b*, and 106*c* as well as each of the two hubs 259*a* and 259*b*. These hubs 259*a*, 259*b* may be embodied as a USB type or any other type of hub known to persons skilled in the art. Also, as disclosed earlier herein, in certain embodiments, the devices 106 could include sensors and span, generally, a wide array of features and functionality. It is hereby contemplated that alternatively, or additionally, in certain embodiments, the devices 106 could include a mirror actuator, a seat actuator, a power lock actuator, or any other device known for actuating one or more functions within the vehicle.

Backbone and Backbone-to-Backbone Connections

In certain embodiments, backbone sections 112 are structural cables. Structural cables may be of the type disclosed in U.S. Pat. App. 62/484,198, entitled "Structural Cable," which is herein incorporated by reference. In other embodiments, the backbone sections 112 may have a cross section as shown in any one of the FIGS. 3-5. Backbone sections 112 may also be another type of cable with structural support or a cable without structural support. In certain embodiments, backbone sections 112 have the cross section as shown in FIGS. 6*a*-6*e* or FIG. 7. These structural cables may be connected to one another. In certain embodiments, backbone sections 112 lack structure. In certain embodiments, backbone sections are made using conductive ink, conductive coatings, conductive paint, or conductive adhesive applied directly applied to car body 102 to form the wiring system 104.

FIG. 3 illustrates a cross-sectional view of the backbone section 112 according to a certain embodiment of the present disclosure. As shown in FIG. 3, the backbone section 112 has an outer sheathing member 124 within which a bus bar 126 and a pair of conductors 128*a* and 128*b* are located. In certain other embodiments, the backbone section 112 may not contain the bus bar 126. As shown in FIG. 3, each of the conductors 128*a*, 128*b* is disposed alongside the bus bar 126 and located in a spaced-apart relation to one another.

A pair of inner sheathing members 130*a*, 130*b* are located outside of the conductors 128*a*, 128*b*. The inner sheathing members 130*a*, 130*b* electrically insulate each of the conductors 128*a*, 128*b* from the bus bar 126. The outer sheathing member 124 and the inner sheathing members 130 may be made of non-conductive materials. The material(s) used to form the outer sheathing member 124 and each of the inner sheathing members 130 may be similar or dissimilar. Example materials that could be used to form the outer and inner sheathing members 124, 130 include polyethylene (PE), polyimide (PI), polypropylene (PP), polyethylene terephthalate (PET), polyethylene naphthalate (PEN), or another insulating material. Various other suitable thermoplastic polymers commonly known to persons skilled in the art may be used to form respective ones of the outer and inner sheathing members 124, 130 disclosed herein.

A pair of conductive shield members 132*a*, 132*b* are also within the outer sheathing member 124 and located on opposing sides of the pair of inner sheathing members 130*a*, 130*b* and the conductors 128*a* and 128*b* respectively. These conductive shield members 132 reduce electromagnetic fields in a space adjoining each of the conductors 128*a*, 128*b* and/or the bus bar 126 by blocking the electromagnetic fields produced by one or more of the conductors 128*a*, 128*b* and the bus bar 126 respectively. The conductive shield members 132 may be made from an electrically conductive material such as copper (Cu) or Aluminum (Al), and may have adhesive as well as non-conductive materials pre-attached to the Cu or Al. The conductive shield members 132 may also contact on both sides of conductors 128, fully wrapping conductors 128.

In certain embodiments, the bus bar 126, the pair of conductors 128, the pair of inner sheathing members 130, and the pair of conductive shield members 132 are parallel or substantially parallel to one another and in a stacked configuration within the outer sheathing member 124 of the backbone section 112. The stacked configuration of the bus bar 126, the pair of conductors 128, the pair of inner sheathing members 130, and the pair of conductive shield members 132 helps to render a compact form to the backbone section 112. This way, an amount of space required to accommodate the backbone section 112, for instance, when tight space constraints are encountered may be minimized.

The bus bar 126 and the conductors 128 are configured to transmit power or data signals to the different endpoints 186, hubs 252, 259, and/or devices 106 (refer to these components in FIGS. 1*a*, 1*b*, and 2). For instance, the bus bar 126 could transmit power while the conductors 128 may transfer data signals. In other embodiments, the conductors 128 may transmit power, and the bus bar 126 may be only structural in function or may be omitted from the backbone section 112. In embodiments, if the bus bar 126 or a conductor 128 carries power or data signals, the component has a line impedance in the range of 5-125 Ohms, single-ended or differential. For instance, it is envisioned that the bus bar 126 and each of the conductors 128*a*, 128*b* of the backbone section 112 depicted in the cross-sectional view of FIG. 3 could be configured to exhibit an impedance of 10.OMEGA. (Ohms). In other embodiments, each of the bus bar 126 and the conductors 128*a*, 128*b* may be configured to exhibit or offer an impedance of 50.OMEGA. (Ohms).

FIGS. 4-7 illustrate additional cross sections of the backbone section 112 according to certain embodiments. As shown, each backbone section 112 contains a bus bar 126. This bus bar 126 may be removed in certain embodiments. In the embodiment shown in FIGS. 4-7, four conductors 128*a*-128*d* are present. In certain embodiments, the bus bar 126 and each of the conductors 128*a*-128*d* may have an impedance of 20.OMEGA. (Ohms). In certain other embodiments, the bus bar 126 and each of the conductors 128*a*-128*d* may exhibit an impedance of 100.OMEGA. (Ohms). Impedance can take a variety of forms and be odd even, common, or differential.

Further, in different embodiments, the thickness of the inner sheathing members 130*a*, 130*b* may be similar or dissimilar. For example, in the backbone section 112 of FIG. 4, a thickness T of the inner sheathing member 130*b* associated with the conductors 128*a*, 128*b* is similar to a thickness T of the inner sheathing member 130*b* associated with the conductors 128*c*, 128*d*. However, in another example as shown in FIG. 5, the thicknesses $T_1$ of the inner sheathing members 130*a*, 130*b* associated with the pair of conductors 128*a* and 128*b* differ from the thicknesses T2 of the inner sheathing members 130*a*, 130*b* associated with the pair of conductors 128*c*, 128*d* respectively. Therefore, it may be noted that the thicknesses of the inner sheathing members 130*a*, 130*b* may be varied during manufacture of the backbone section 112 to suit specific requirements of an application.

FIGS. 6*a*-6*e* and 7 illustrate additional cross sections of the backbone section 112 according to certain embodiments. In certain embodiments, cross sections of one or more conductors 128*a-d* may be dissimilar. As shown in FIGS. 6*a*-6*e* and 7, the cross-sections associated with the conductors 128*c*, 128*d* is smaller and hence, dissimilar to that associated with the conductors 128*a*-128*b* respectively. In other embodiments, the cross-section of the conductors 128*a*-128*d* can be similar to one another. Additional conductors (not shown) may also be added in addition to 128*a*-128*d*, and may be added in the same plane, or alternatively, above or below conductors 128*a*-128*d*.

Figure 6E:
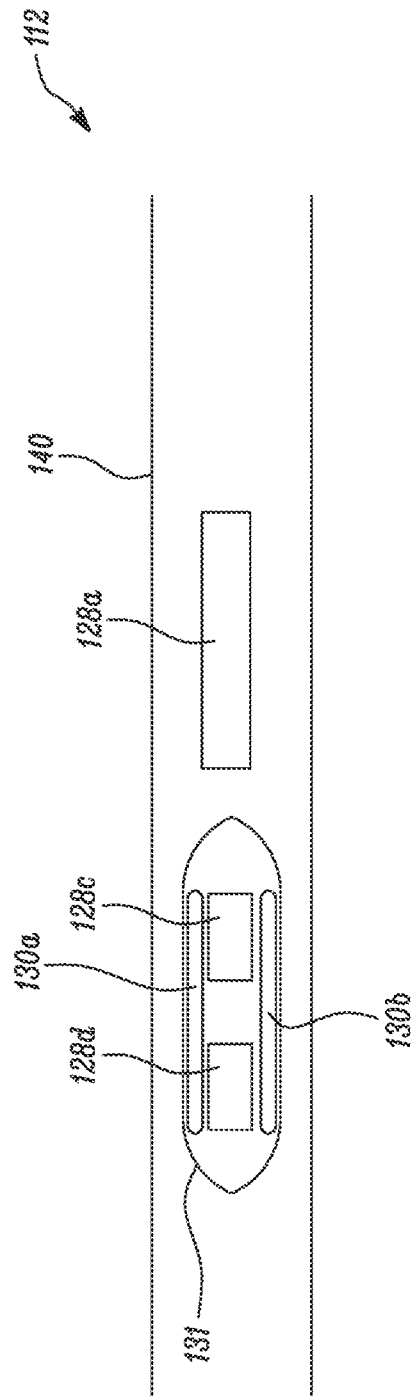
Figure 7:
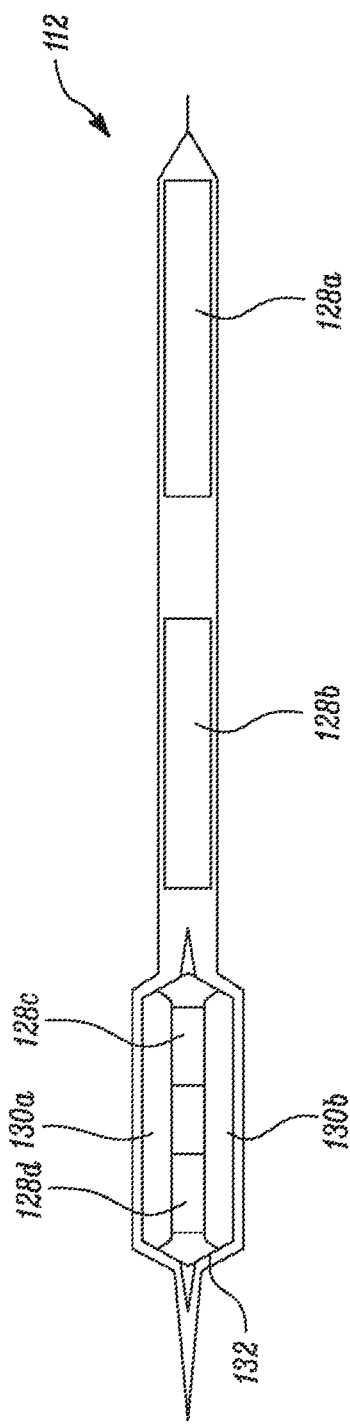
FIG. 7 illustrates a different cross-section of the backbone section that could be implemented in the wiring system according to certain embodiments of the current invention.

Moreover, as shown in FIGS. 6*a* and 7, a pair of inner sheathing members 130*a*, 130*b* are outside of conductors 128*a*, 128*b*. These conductors 128*c* and 128*d* are shielded by a conductive shield member 132 that surrounds the pair of inner sheathing members 130*a*, 130*b*. Multiple conductive shield members 132 may exist within the backbone section 112. For example, more conductors (not shown) alongside conductors 128 may be added, and may also include a conductive shield member 132. The conductors 128*a* and 128*b* may carry power while the conductors 128*c* and 128*d* may carry data signals. An insulating sheathing layer 130 may additionally be present as shown in the view of FIG. 6*a*. One or more adhesive layers may also be present. FIG. 6*a* shows two adhesive layers 410*a* and 410*b*. An adhesive layer adheres the backbone section 112 to the vehicle, or another desired location. In other embodiments, a sealing layer 140 (also referred to herein as an outer sheathing member or outer sheating material) might exist around the conductors 128*a*-128*d* and the insulating sheathing layer 130. FIG. 6*a* shows sealing layer 140 that seals the conductors 128*a*-128*d* from dust and/or water vapor. When present, the adhesive layer 410*a* and 410*b* may be inside the sealing layer 140 (that is, part of the sealing layer 140 could be on the vehicle or component to which the backbone section 112 is adhered). Alternatively, the adhesive layers 410*a* and 410*b* may be outside of the sealing layer 140.

In embodiments, conductors 128*a*-128*d* carry voltages of 6V or less. In other embodiments, one or more conductors 128*a*-128*d* carry voltages of greater than 5V, for example, one conductor might carry a voltage of approximately 10V, another a voltage of approximately 100V, while third and fourth conductors carry a voltage of approximately 5V.

FIG. 6*b* illustrates a cross-section of a backbone section 112 in accordance with certain embodiments of the present disclosure. The backbone section 112 includes conductors 128*a*-128*d*. A non-conductive inner sheathing member 130 insulates one or more of conductors 128*a*-128*d*. In embodiments, the inner sheathing member 130 surrounds two conductors. In other embodiments, the inner sheathing member 130 surrounds fewer or more than two conductors. Inner sheathing member 130 is necessary to insulate a conductor from shielding layer 131 if shielding layer is present around a conductor. As shown in FIG. 6*b*, conductors 128*c*, 128*d* are surrounded by inner sheathing member 130. The inner sheathing member 130 is formed from an insulating material, such as polyethylene (PE), polyimide (PI), polypropylene (PP), polyethylene terephthalate (PET), polyethylene naphthalate (PEN), or another insulating material. Various other suitable thermoplastic polymers commonly known to persons skilled in the art may be used to form the inner sheathing member 130 disclosed herein. Conductive shielding layer 131 surrounds and abuts inner sheathing member 130. In embodiments, conductive shielding layer 131 surrounds fewer or more than two conductors. Conductive shielding layer 131 may be made from Cu, Al, or another conductive metal, and may be plated (or otherwise covered) with Sn, Ni, Au, or another conductive material. In embodiments, conductive shielding layer 131 is formed from a non-conductive material and plated (or otherwise covered) with a conductive material, such as Cu, Al, Sn, Ni, Au, another metal, or another conductive material.

FIG. 6*c* illustrates a cross-section of a backbone section 112 in accordance with certain embodiments of the present disclosure. The backbone section 112 includes conductors 128*a-r*. The sets of conductors 128*a-b*, and 128*c-d* may exhibit similarity of configuration and function with that disclosed in conjunction with embodiments herein. Conductors 128*c-d* and 128*e-f* are surrounded by the inner sheathing member 130 and the conductive shielding layer 131. Inner sheathing member 130 may fully encase conductors, as shown in FIG. 6*c*, or alternatively, inner sheathing member 130 may be disjointed and exhibit an open configuration whereby it is not continuous and includes void regions.

In the embodiments described in this disclosure, conductors 128*e-f* and 128*g-r* may be formed from the same material, or alternatively, they may be formed from dissimilar material. For example, each conductor from the sets of the conductors 128*e-f* and 128*g-r* may be copper while each conductor from the sets of conductors 128*a-b* and 128*c-d* may be aluminum. In certain situations, certain of conductors 128*a-b* and 128*c-d* are used to transmit data in the form of control and/or feedback signals between devices, for example, a PCBA 196 (shown in FIGS. 19*a-d*), a processing unit, or control functionality, and a safety device (not shown) within the automobile 100 (refer to FIGS. 1*a-b*). Such safety device may be an airbag, but is not limited thereto.

Further, conductors 128*e-f* and 128*g-r* may transmit data in one or both directions between devices. For example, conductors 128*e-f* may transmit control signals from PCBA 196 (or another location) to one or more safety devices, while conductors 128*g-r* may transmit feedback signals from the safety devices to a central processor, control functionality, or another location. In another example, conductors 128*e-f* and 128*g-r* may be capable of transmitting data bi-directionally between devices, for instance, a central processor or control functionality and the safety device.

Each conductors 128*e-f* may have the same cross sectional dimensions (width and height), or may have different cross sectional dimensions. For example, the width and height of each conductors 128*a-b* may be a specific width and height, while conductors 128*e-f* are only 50-80% of the of the width and height of conductors 128*a* and/or 128*b*. Similarly, the thickness of the inner sheathing member 130 associated with the set of conductors 128*e-f* may be similar or dissimilar to the thickness of the inner sheathing member 130 surrounding the conductors 128*c-d*. When dissimilar thicknesses are present, the inner sheathing member 130 surrounding conductors 128*e-f* may be thicker or thinner than the thickness of inner sheathing member 130 surrounding conductors 128*c-d*. Further, the dimensions of conductors 128*g-r* may be the same or different than the dimension of conductors 128*e-f*. The dimensions and material of the conductors 128*a-b*, 128*c-d*, 128*e-f*, and 128*g-r* may be selected depending on the function the conductors are to perform, for example, transmitting control and/or feedback signals.

FIGS. 6*d* and 6*e* illustrate additional embodiments backbone section 112. As depicted in FIG. 6*d*, unshielded conductor 128*a* is not present (compared to FIG. 6*c*). That is two shielded conductors 128*c-d* and unshielded conductor 128*a* are present. In addition, conductors 128*g-r* are also present and conductors 128*e-f* are not present (compared to FIG. 6*c*). In the embodiment shown in FIG. 6*e*, the backbone section 112 includes shielded conductors 128*c-d* and unshielded conductor 128*a*.

Figure 6F:
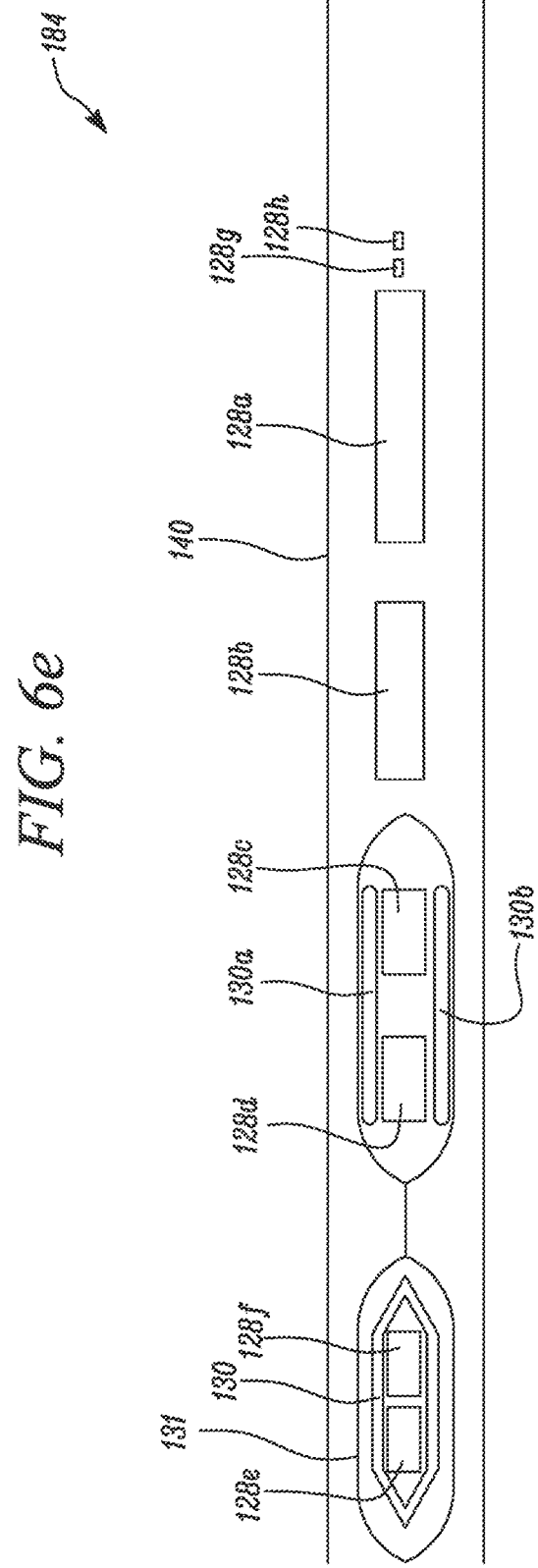
FIG. 6f illustrates a cross-section of an umbilical cable that could be implemented in the wiring system for connecting with the backbone section of FIG. 6c according to certain embodiments of the current invention.

FIG. 6f illustrates a cross-section of an umbilical cable 184 that can be connected to the backbone section 112 of FIG. 6c, via the PCBA 196 (refer to FIGS. 19a-d). The umbilical cable 184 illustrates a similar configuration of the conductors that are included within the backbone section 112 of FIG. 6c. The major difference is that fewer conductors 128g-r are present, specifically only conductors 128g-h are present. When conductors 128g-h are used to transmit signals from a safety device, the umbilical cable need only contain two of conductors 128g-h, while the backbone section 112 must include more conductors so that it may carry signals from other connected umbilical cables. For example, as shown in FIG. 6c, the backbone section has twelve conductors 128g-r, while the umbilical cable 184 has two conductors 128g-h, as shown in FIG. 6f.

The twelve conductors 128g-r within the backbone section (as shown, for example, in FIG. 6c), may be grouped into pairs, for example, conductors 128g-h, 128i-j, 128k-l and so on, and establish connections to multiple safety devices via multiple different umbilical cables 184. For example, with the twelve conductors 128g-r shown in the backbone section 112 of FIG. 6c, six umbilical cables 184, as shown in FIG. 6f can be connected to the backbone section 112, with each umbilical cable later connected to a safety device and used to transmit signals from the safety device to a processing unit or control functionality. In certain embodiments, umbilical cables 184 includes more than one pair of conductors, for example, two pairs of conductors 128g-h and 128i-j. In other embodiments, the backbone section 112 includes fewer or more conductors than those shown in FIG. 6c to facilitate connections with more or fewer safety devices.

Figure 8:
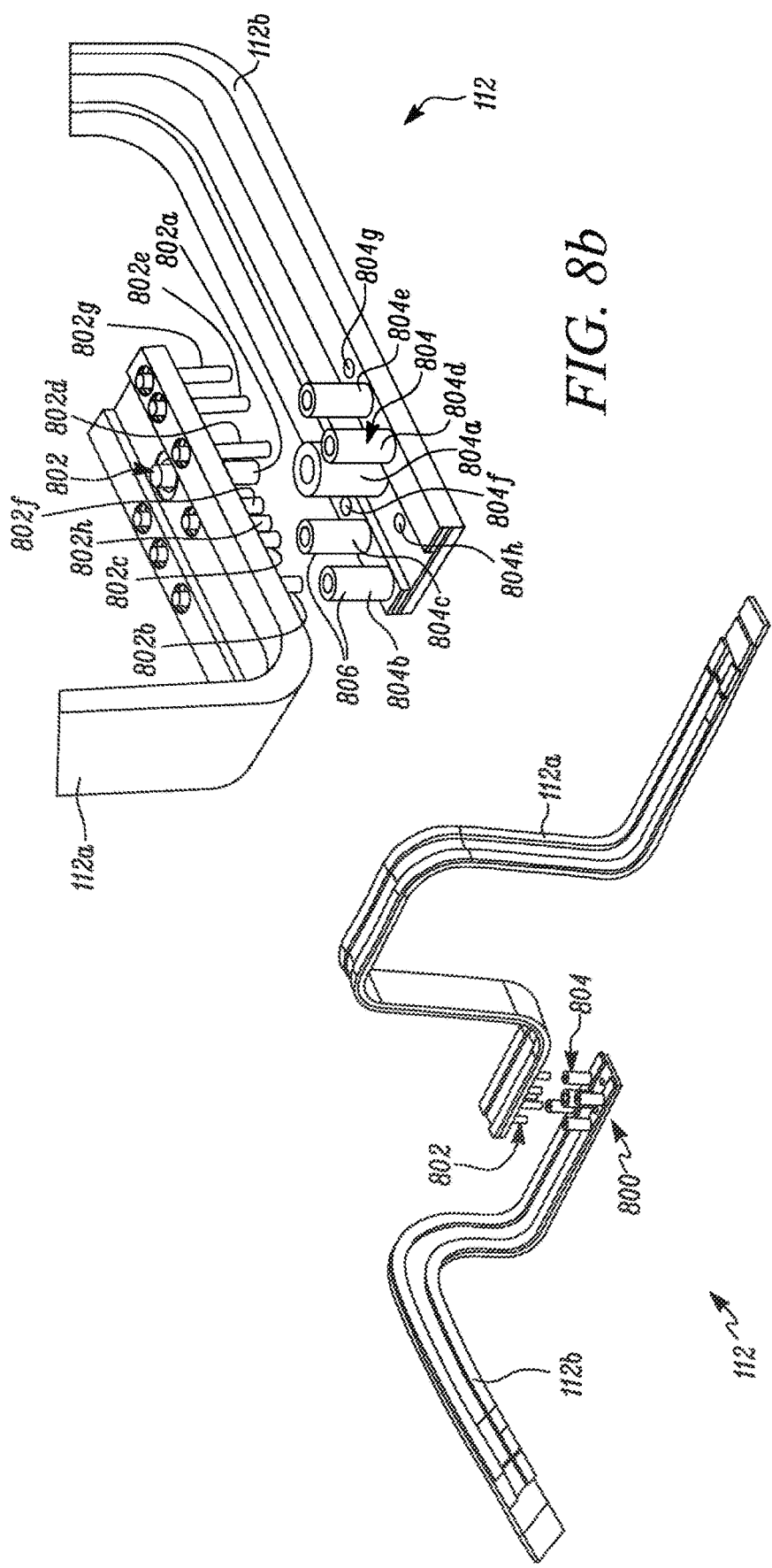
FIG. 8a illustrates a perspective view of a pair of sections associated with the backbone section that are configured to be mutually connected with the help of an interconnect system according to certain embodiments of the current invention.
FIG. 8b illustrates a zoomed-in perspective view of the interconnect system showing pins on a first section and receptacles on a second section of the backbone section according to certain embodiments of the current invention.

FIG. 8a illustrates an exploded view of the backbone section 112 with an interconnect system 800 consisting of pins 802 and receptacles 804 connecting a first backbone section 112a and a second backbone section 112b. Each backbone section 112a, 112b may be located adjacent and connected to one another with the help of the interconnect system 800. As shown, the interconnect system 800 includes pins 802 that are disposed on the first backbone section 112a and receptacles 804 disposed on the second backbone section 112b.

FIG. 8b illustrates a zoomed-in view of interconnect system 800 from FIG. 8a showing the pins 802a-802h from the first backbone section 112a and the receptacles 804a-804h from the second backbone section 112b. As shown, each pin 802 is connected (usually physically and electrically) with one of the bus bar 126, one or more conductors 128a-128d, or one or more conductive shield members 132a-132b (refer to FIG. 5) of the first section 112a of the backbone section 112 shown in FIG. 8a. For instance, pin 802a may be connected to the bus bar 126 (refer to FIG. 5) that is part of the first section 112a, while pins 802b, 802c, 802d, and 802e may be connected to conductors 128a, 128b, 128c, and 128d (refer to FIG. 5) of the first section 112a of the backbone section 112 shown in FIG. 8a.

Moreover, pins 802f, 802g may be connected to conductive shield members 132a and 132b which provide shielding for conductors 128a-b, and 128c-d (refer to FIG. 5) respectively, offering a continuous electrical return path for data signals. Further, pin 802h may be connected to conductive shield member 132b (refer to FIG. 5) of the first section 112a of the backbone section 112 (refer to FIGS. 8a-8b).

Further, as shown in FIGS. 8a-8b, the interconnect system 800 also includes receptacles 804 that are on an end portion of the second section 112b (although they could be anywhere along the second section). These receptacles 804 are configured to accept pins 802, that is, the size and shape of the receptacle opening accept pins 802. For instance, the receptacle 802a may be connected with the bus bar 126 of the second section 112b and hence, connects the bus bar 126 of the first section of the first section 112a through accepting pin 802a. Similarly, receptacles 804b, 804c, 804d, and 804e are connected to the conductors 128a, 128b, 128c, and 128d of the second section 112b and connected to conductors 128a, 128b, 128c, and 128d of the first section 112a though pins 802b, 802c, 802d, and 802e respectively. The pins 802 and receptacles 804 may take alternate shapes, materials, and geometries beyond cylindrical profiles, and pins 802 and receptacles 804 of varying shapes, materials, and geometries may co-exist.

Also, with continued reference to FIGS. 5 and 8b, some portion of the outer sheathing member 124 may be stripped-off to define additional receptacles 804f, 804g, and 804h. The receptacles 804f and 804g may be connected to conductive shield members 132a (refer to FIG. 5) that are connected to conductors 128a-b and 128c-d respectively. Further, the receptacle 804h may be connected to conductive shield member 132b. These receptacles 804f, 804g, and 804h would be configured to accept pins 802f, 802g, and 802h respectively (refer to FIG. 8b) and form the desired connection between the first and second sections 112a, 112b.

In certain embodiments, the interconnect system 800 may be stabilized with the help of a cumulative force from radial pressure of an engagement between a tubular wall 806 containing each receptacle 804 and its corresponding pin 802 when engaged to one another. That is, the engagement between each pin 802 and the tubular wall 806 of receptacle 804 would be snug such that a radial force would apply to hold the pin 802 into the receptacle 804 and create a contact between the two. The pins 802 and receptacles 804 may also be welded as necessary to increase strength at the connection point.

Figure 9:
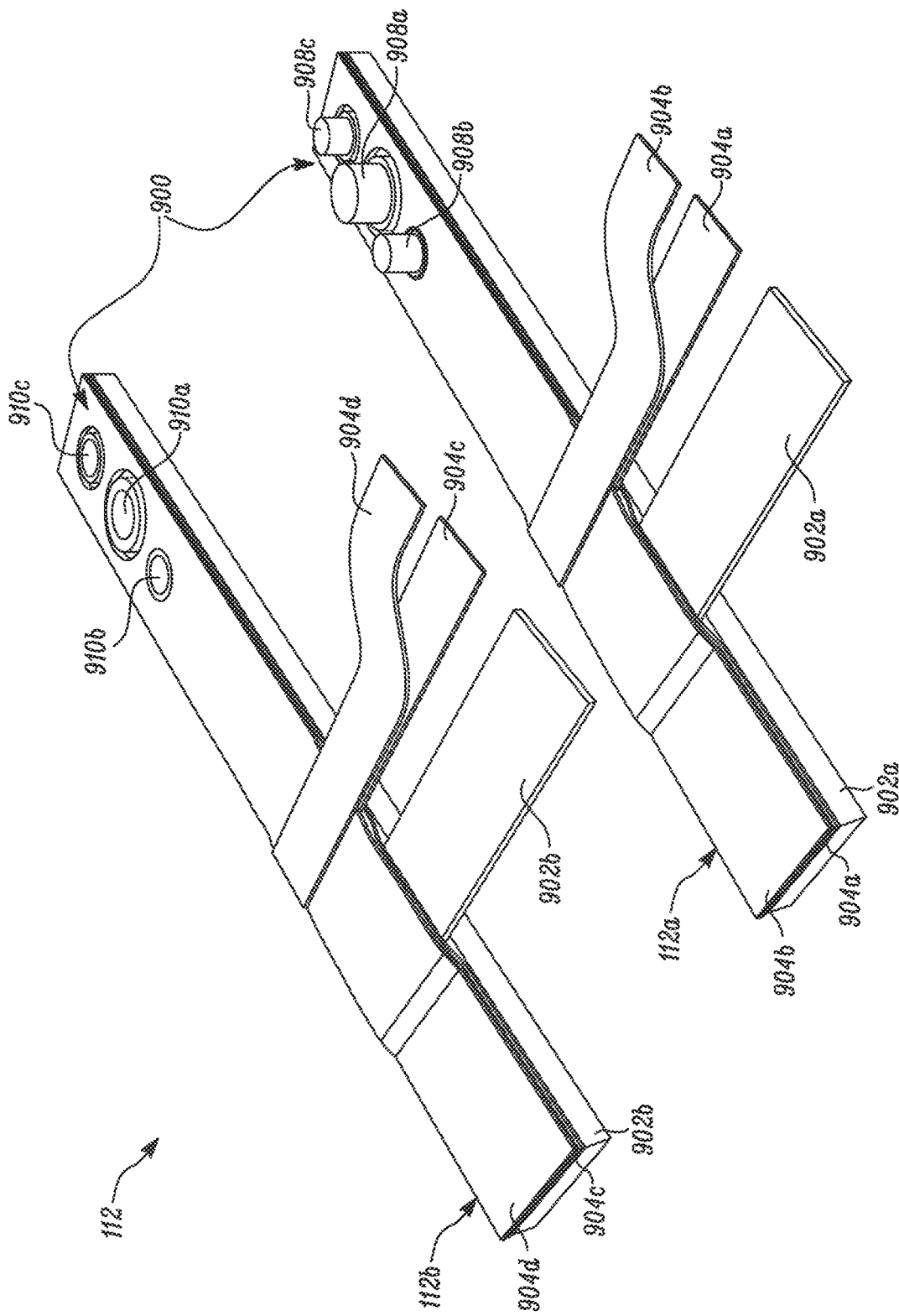
FIG. 9 illustrates sections of a backbone showing an interconnect system with cylindrical pins and receptacles according to certain embodiments of the current invention.

FIG. 9 shows an exploded view of a backbone section 112 with a first section 112a and a second section 112b connected together according to a certain embodiment of the present disclosure. As shown, the first section 112a includes a bus bar 902a and a pair of conductors 904a, 904b that are disposed successively over the bus bar 902a of the first section 112a. Similarly, the second section 112b includes a bus bar 902b and a pair of conductors 904c, 904d that are disposed successively over the bus bar 902b of the second section 112b. An interconnect system 900 for connecting the first and second sections 112a, 112b includes three pins 908a-c located on the first section 112a and three receptacles 910a-c located on the second section 112b. The pin 908a is connected to the bus bar 902a of the first section 112a while the pins 908b, 908c are connected to the pair of conductors 904a, 904b associated with the first section 112a. Likewise, receptacle 910a is connected to the bus bar 902b of the second section 112b while the receptacles 910b, 910c are connected to the pair of conductors 904c, 904d associated with the second section 112b. Pins 908a, 908b, and 908c are configured to engage with receptacles 910a, 910b, and 910c respectively. In the illustrated embodiments of FIG. 9, it may be noted that each of the pins 908 and receptacles 910 are cylindrically shaped so that these cylindrically-shaped pins 908 and receptacles 910 correspond with one another to facilitate a mutual engagement of the pins 908 to the receptacles 910. The connection method between pins 908 and receptacles 910 may comprise of inductive soldering, press-fitting, brazing, wave soldering, or be conductive adhesive based. Further, it may also be noted that strips of conductive material/s forming each of the bus bars 902a, 902*b*, and each of the conductors 904*a-d* may also be disposed laterally with respect to corresponding ones of each of the bus bars 902*a-b*, and each of the conductors 904*a-d* so that power and/or data signals can be transferred in a direction laterally away from one or more points that are located partway along a length of the first and second sections 112*a*, 112*b* of the backbone section 112.

Figures 10A, 10B:
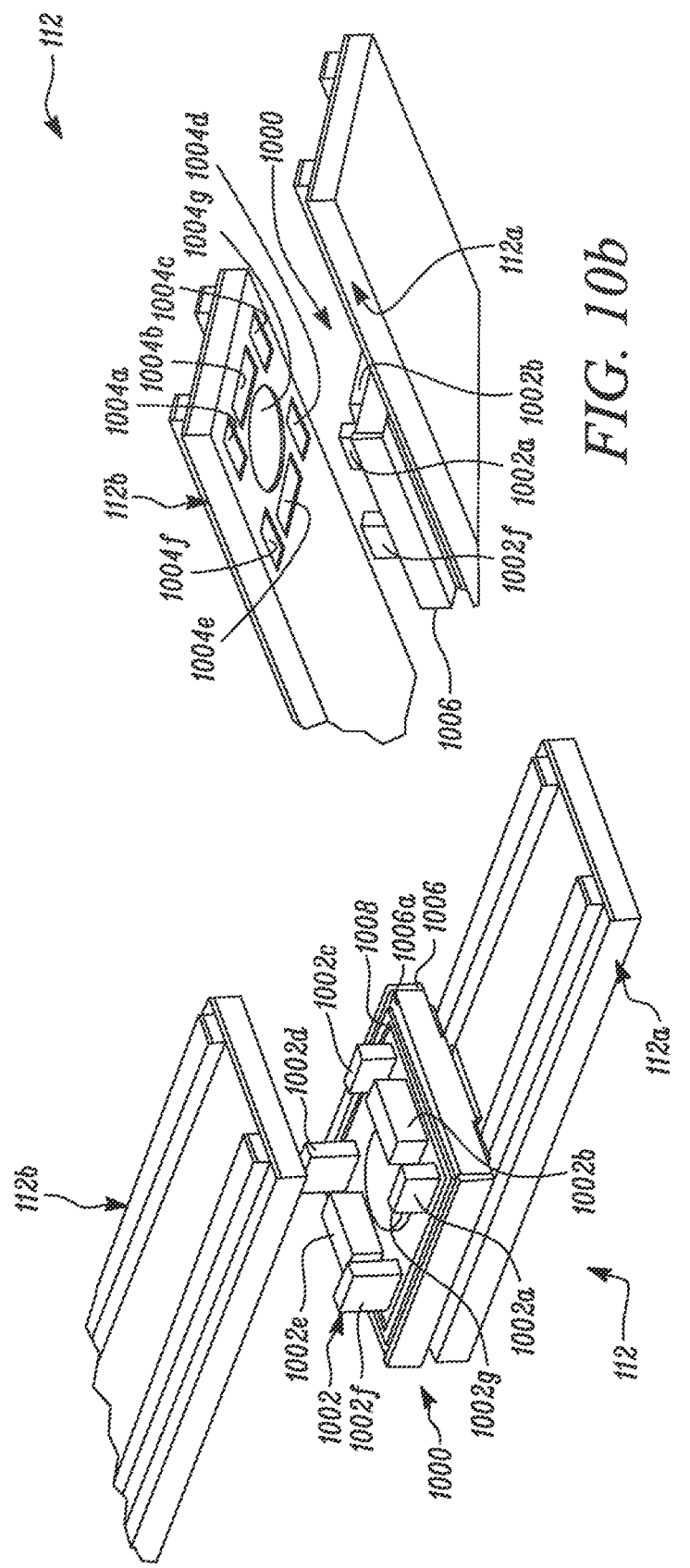
FIGS. 10a-10b illustrate a section of a backbone showing an interconnect system in which polygonal pins are encased in an overmold bridge according to certain embodiments of the current invention.

According to another embodiment shown in FIGS. 10*a*-10*b*, the first section 112*a* of the backbone section 112 includes pins 1002, for instance, pins 1002*a*-1002*f* that are polygonal in shape, and other pins 1002, for instance, pin 1002*g* that are cylindrical in shape. Moreover, in additional embodiments, pins 1002 are shown partially encased in an overmold bridge 1006 formed of a non-conducting material, for example, epoxy, acrylic, silicone rubber, or other polymer base material, such as polybutylene terephthalate (PBT). As best shown in FIG. 10*b*, the second section 112*b* defines some receptacles 1004, for instance, receptacles 1004*a-f* that are polygonal in shape, and other receptacles 1004, for instance, receptacle 1004*g* that is cylindrical in shape. Each of receptacle 1004 from the second section 112*b* is configured to connect to corresponding pin 1002 from the first section 112*a*. The bridge 1006 can be adhered to the second section 112*b* with the help of a gasket 1008 that could include, for example, a cure-in-place (CIP) gasket or a form-in-place (FIP) as known to persons skilled in the art, for attachment as well as sealing purposes. The gasket 1008 may also be overmolded over the bridge 1006. As shown best in FIG. 10*a*, the gasket 1008 is applied to a surface 1006*a* of the bridge 1006 facing the second section 112*b* so that the gasket 1008 helps the bridge 1006 to adhere with the second section 112*b* of the backbone section 112 and therefore, stabilize the interconnect system 1000 upon engagement of the pins 1002 to their corresponding receptacles 1004.

Figure 11A:
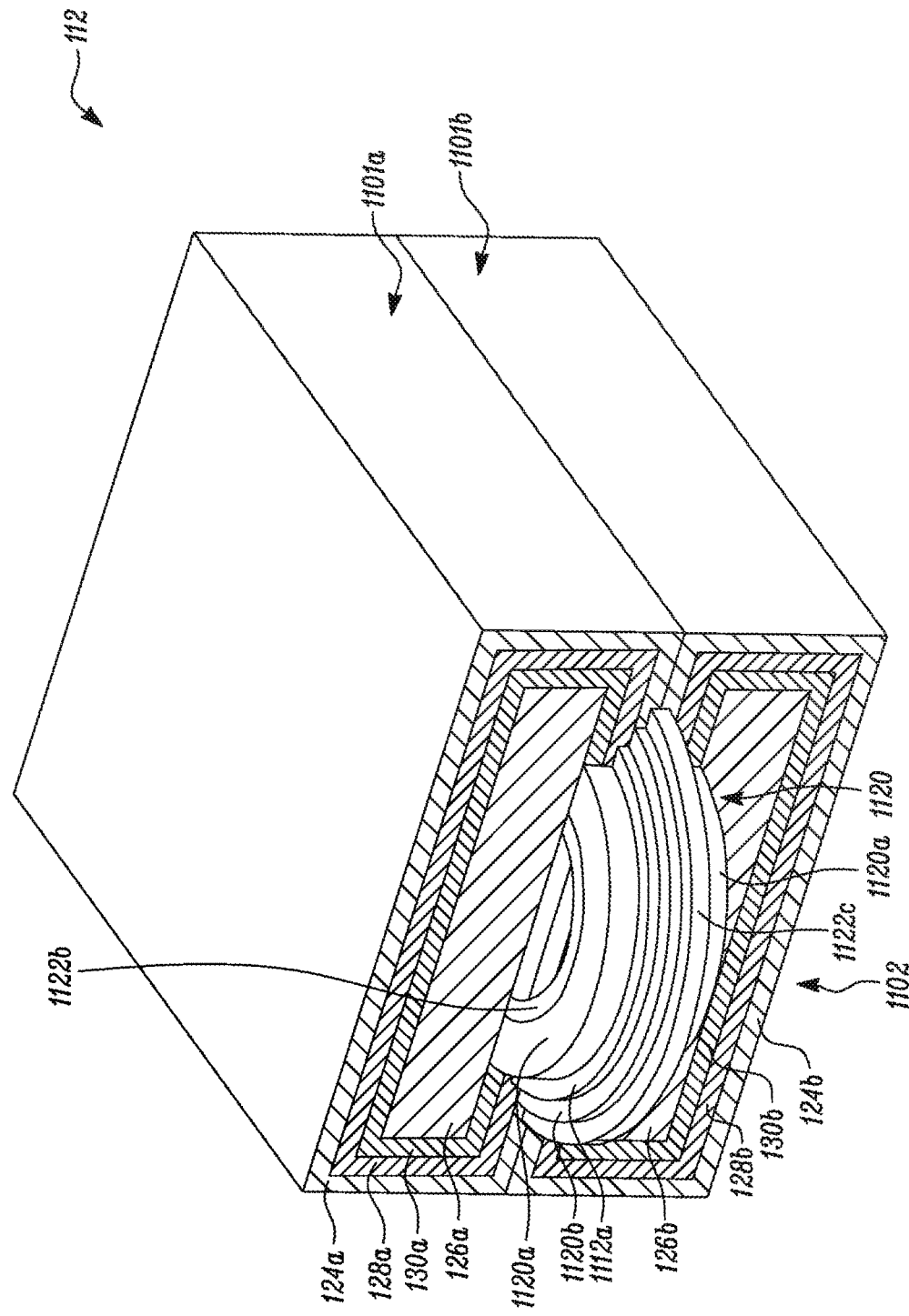
FIGS. 11a-11f illustrate different configurations of backbone sections and interconnect systems used to connect the backbone sections according to certain embodiments of the current invention.

Referring to FIG. 11*a*, a backbone section 112 according to an embodiment of the present disclosure includes a first half 1101*a* and a second half 1101*b*. Moreover, as shown in FIG. 11*a*, first and second halves 1101*a*, 1101*b* are stacked on top of one another. The first half 1101*a* includes a bus bar 126*a* and a conductor 128*a* that is stacked around the bus bar 126*a* with an inner sheathing member 130*a* positioned between the bus bar 126*a* and the conductor 128*a*. Likewise, the second half 1101*b* includes a bus bar 126*b* and a conductor 128*b* that is stacked around the bus bar 126*b* with an inner sheathing member 130*b* positioned between the bus bar 126*b* and the conductor 128*b*. An interconnect system 1102 is provided to connect the first and second halves 1101*a*, 1101*b* to another backbone section. As shown in the illustrated embodiment of FIG. 11*a*, the interconnect system 1102 includes bridging conductors, bridging shield, and insulating layers (1120*a*, 1120*b*, 1120*c*, 1122*b*, 1122*c*), that serve to connect the bus bars and conductors in the first and second halves 1101*a*, 1101*b* to corresponding halves in another backbone section.

Figure 11B:
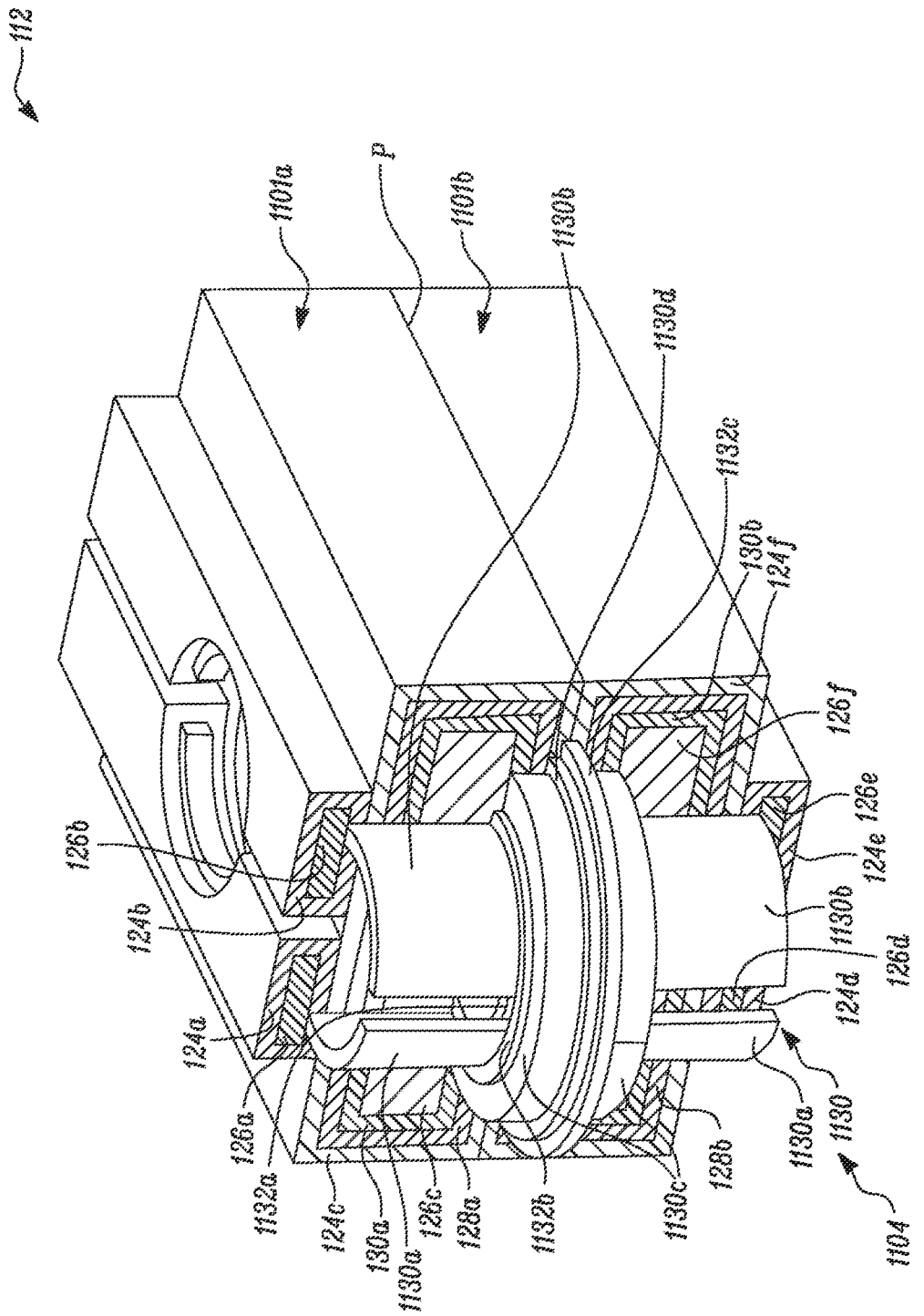

Referring to FIG. 11*b*, a backbone section 112 according to an embodiment of the present disclosure includes a first half 1101*a*, and a second half 1101*b* that is placed in a stacked configuration with respect to the first half 1101*a*. As shown, the first and second halves 1101*a*, 1101*b* are identical to one another and are placed symmetrically about a parting line 'P'. The first half 1101*a* includes three bus bars 126*a*, 126*b*, 126*c* and a conductor 128*a*. As shown, the conductor 128*a* is disposed about the bus bar 126*c*. Further, the first half 1101*a* also includes three outer sheathing members 124*a*, 124*b*, 124*c* and an inner sheathing member 130*a*. The outer sheathing members 124*a*, 124*b*, 124*c* are configured to insulate the bus bars 126*a*, 126*b* and the conductor 128*a* respectively while the inner sheathing member 130*a* is configured to mutually insulate the bus bar 126*c* and the conductor 128*a* from one another.

Similarly, the second half 1101*b* includes three bus bars 126*d*, 126*e*, 126*f* and a conductor 128*b*. As shown, the conductor 128*b* is disposed about the bus bar 126*f*. Moreover, the second half 1101*b* also includes three outer sheathing members 124*d*, 124*e*, 124*f* and an inner sheathing member 130*b*. The outer sheathing members 124*d*, 124*e*, 124*f* are configured to insulate the bus bars 126*d*, 126*e* and the conductor 128*b* respectively while the inner sheathing member 130*b* is configured to mutually insulate the bus bar 126*f* and the conductor 128*b* from one another. An interconnect system 1104 is provided to connect the first and second halves 1101*a*, 1101*b* to other backbone sections. As shown, the interconnect system 1104 includes bridging conductors, bridging shield, and insulating layers (1130*a*, 1130*b*, 1130*c*, 1130*d*, 1132*a*, 1132*b*, 1132*c*), that serve to connect the bus bars and conductors in the first and second halves 1101*a*, 1101*b* to corresponding halves in another backbone section.

Figure 11C:
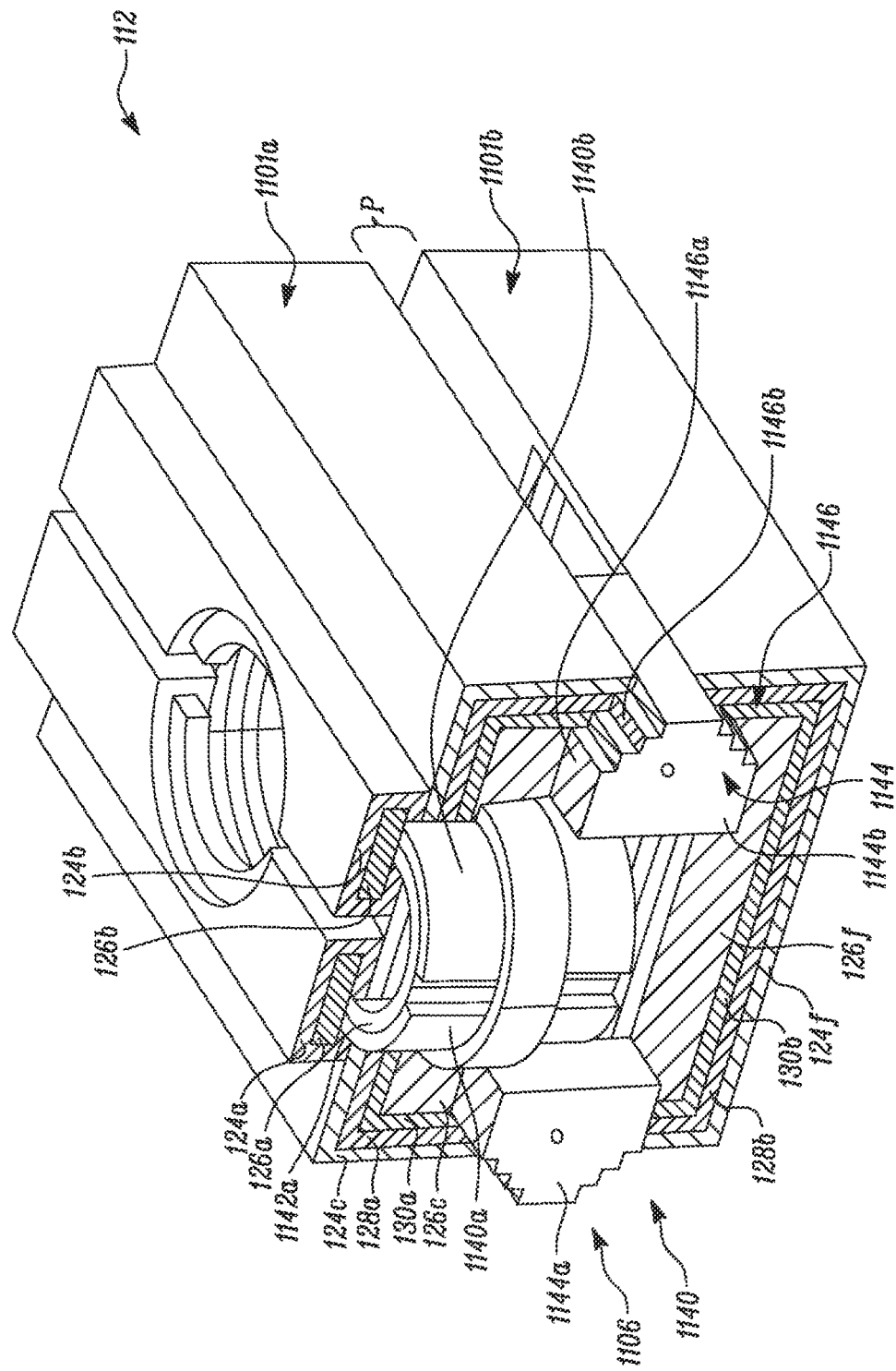
Figure 11D:
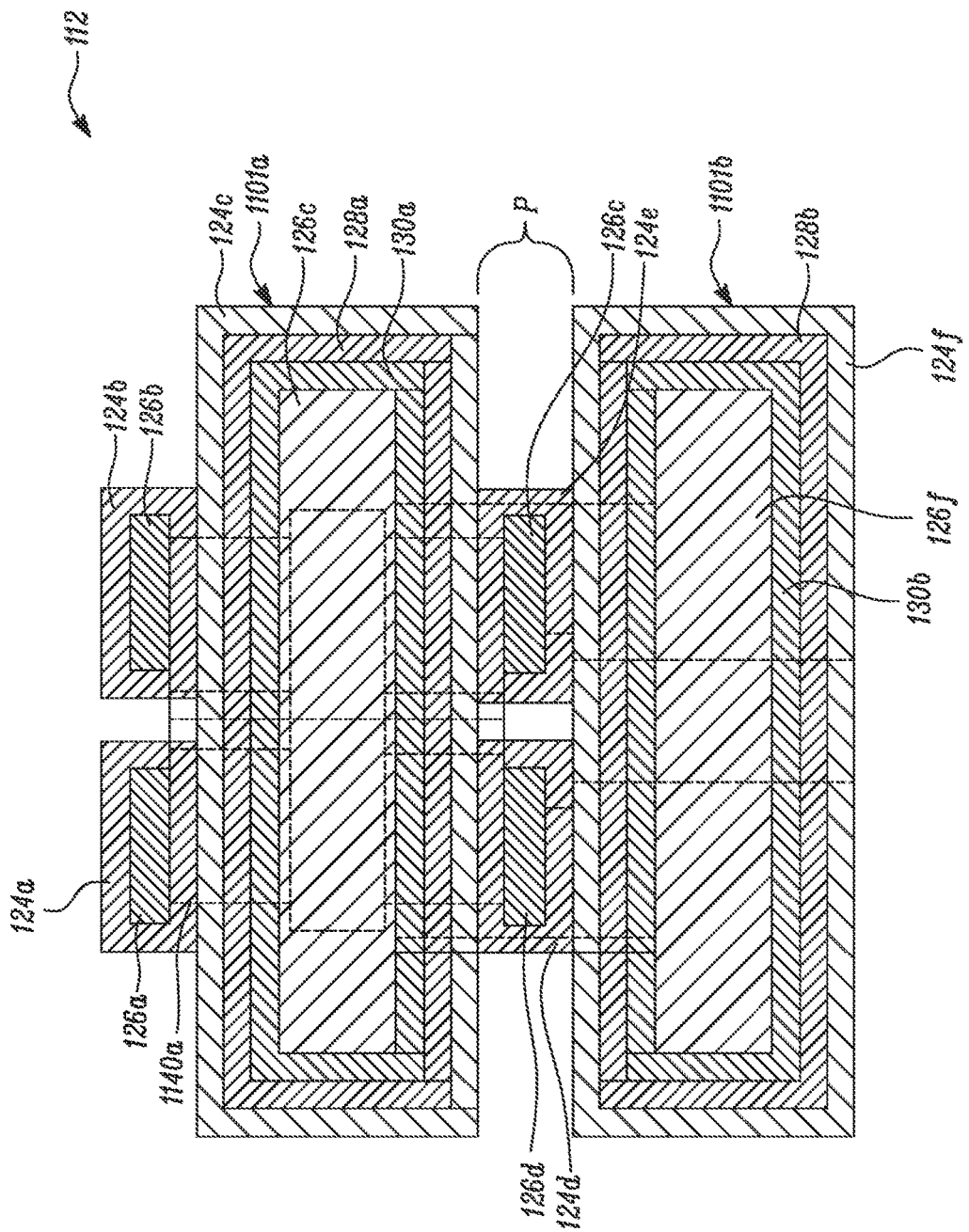

Referring to FIGS. 11*c*-11*d*, a backbone section 112 according to another embodiment of the present disclosure includes a first half 1101*a* and a second half 1101*b* that is placed in a stacked configuration with respect to the first half 1101*a*. As shown, the first and second halves 1101*a*, 1101*b* are identical to one another. However, the first and second halves 1101*a*, 1101*b* are asymmetrical to one another about a parting region 'P'. The first half 1101*a* includes three bus bars 126*a*, 126*b*, 126*c* and a conductor 128*a*. As shown, the conductor 128*a* is disposed about the bus bar 126*c*. Further, the first half 1101*a* also includes three outer sheathing members 124*a*, 124*b*, 124*c* and an inner sheathing member 130*a*. The outer sheathing members 124*a*, 124*b*, 124*c* are configured to insulate the bus bars 126*a*, 126*b* and the conductor 128*a* respectively while the inner sheathing member 130*a* is configured to mutually insulate the bus bar 126*c* and the conductor 128*a* from one another.

Similarly, the second half 1101*b* includes three bus bars 126*d*, 126*e*, 126*f* and a conductor 128*b*. As shown, the conductor 128*b* is disposed about the bus bar 126*f*. Moreover, the second half 1101*b* also includes three outer sheathing members 124*d*, 124*e*, 124*f* and an inner sheathing member 130*b*. The outer sheathing members 124*d*, 124*e*, 124*f* are configured to insulate the bus bars 126*d*, 126*e* and the conductor 128*b* respectively while the inner sheathing member 130*b* is configured to mutually insulate the bus bar 126*f* and the conductor 128*b* from one another.

An interconnect system 1106 is provided to connect the first and second halves 1101*a*, 1101*b*. The interconnect system 1106 includes bridging conductors, bridging shield, and insulating layers (1140*a*, 1140*b*, 1142*a*, 1144*a*, 1144*b*, 1146*a*, 1146*b*), that serve to connect the bus bars and conductors in the first and second halves 1101*a*, 1101*b* to corresponding halves in another backbone section.

Figure 11E:
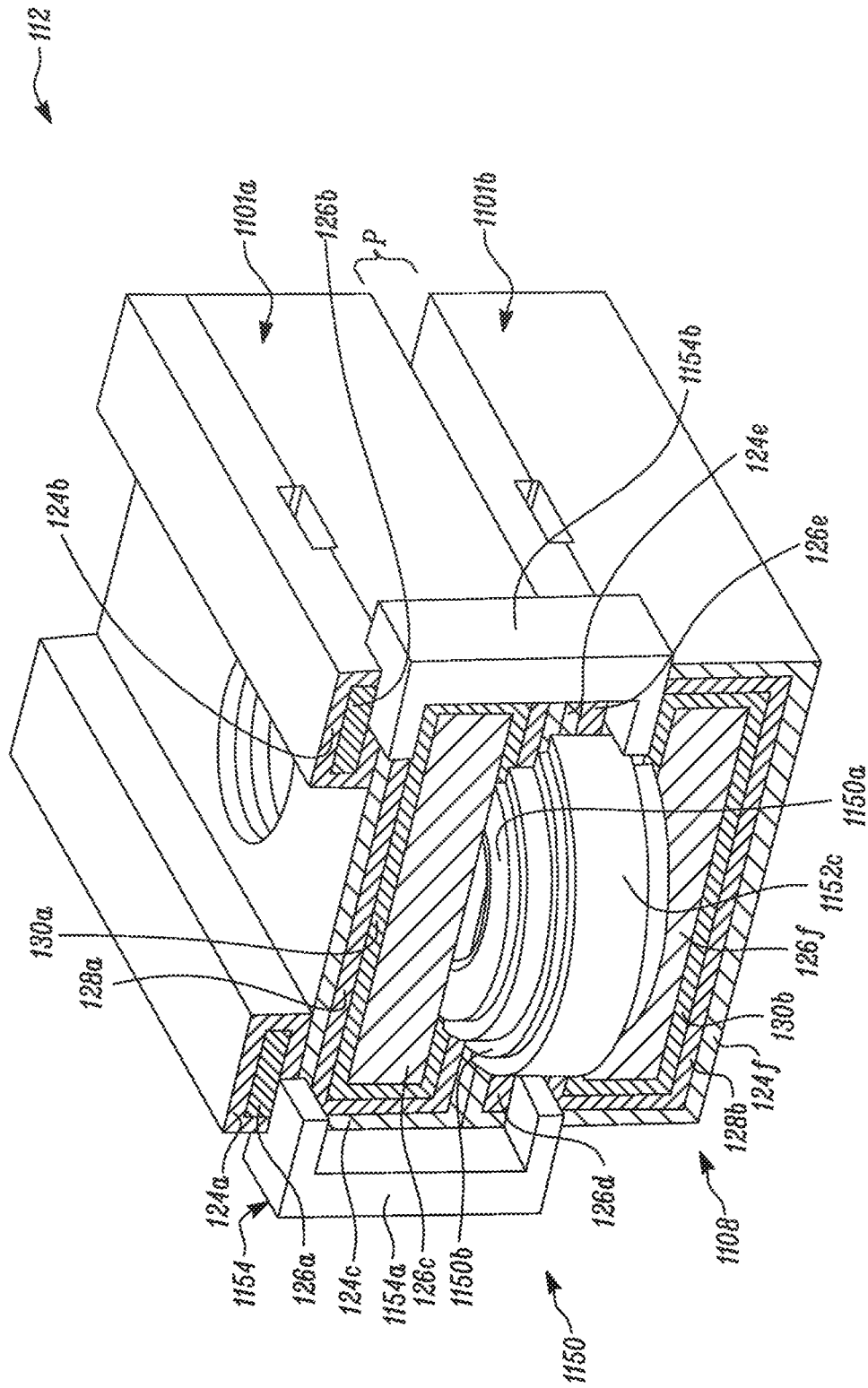

Referring to FIG. 11*e*, a backbone section 112 according to an embodiment of the present disclosure may include a first half 1101*a*, and a second half 1101*b* that is stacked on top of the first half 1101*a*. The first and second halves 1101*a*, 1101*b* are asymmetrical about region 'P'. The first half 1101*a* includes three bus bars 126*a*, 126*b*, 126*c* and a conductor 128*a*. As shown, the conductor 128*a* is disposed about the bus bar 126*c*. Further, the first half 1101*a* also includes three outer sheathing members 124*a*, 124*b*, 124*c* and an inner sheathing member 130*a*. The outer sheathing members 124*a*, 124*b*, 124*c* are configured to insulate the bus bars 126*a*, 126*b* and the conductor 128*a* respectively while the inner sheathing member 130*a* is configured to mutually insulate the bus bar 126*c* and the conductor 128*a* from one another.

Similarly, the second half 1101*b* includes three bus bars 126*d*, 126*e*, 126*f* and a conductor 128*b*. As shown, the conductor 128*b* is disposed about the bus bar 126*f*. Moreover, the second half 1101*b* also includes three outer sheathing members 124*d*, 124*e*, 124*f* and an inner sheathing member 130*b*. The outer sheathing members 124*d*, 124*e*, 124*f* are configured to insulate the bus bars 126*d*, 126*e* and the conductor 128*b* respectively while the inner sheathing member 130*b* is configured to mutually insulate the bus bar 126*f* and the conductor 128*b* from one another. An interconnect system 1108 is provided to connect the first and second halves 1101*a*, 1101*b* to another backbone section and includes bridging conductors, bridging shield, and insulating layers.

Figure 11F:
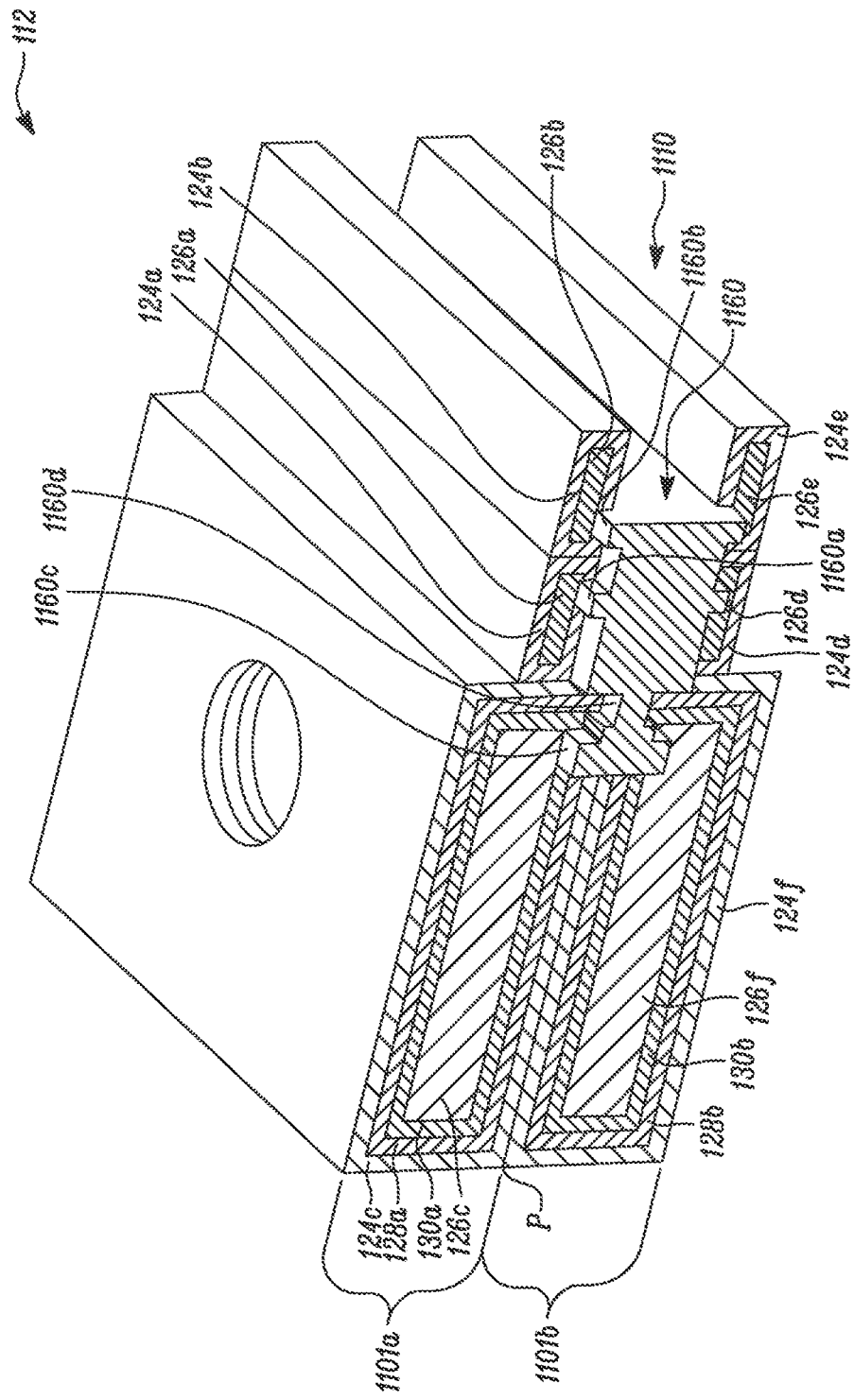

Referring to FIG. 11*f*, a backbone section 112 according to another embodiment includes a first half 1101*a* and a second half 1101*b* that are placed in a stacked configuration. The first and second halves 1101*a*, 1101*b* are placed symmetrically about a parting line 'P'. The first half 1101*a* includes three bus bars 126*a*, 126*b*, 126*c* and a conductor 128*a*. As shown, the conductor 128*a* is disposed about the bus bar 126*c*. The bus bars 126*a*, 126*b* are stacked successively and disposed alongside the bus bar 126*c*. Further, the first half 1101*a* also includes three outer sheathing members 124*a*, 124*b*, 124*c* and an inner sheathing member 130*a*. The outer sheathing members 124*a*, 124*b*, 124*c* are configured to insulate the bus bars 126*a*, 126*b* and the conductor 128*a* respectively while the inner sheathing member 130*a* is configured to mutually insulate the bus bar 126*c* and the conductor 128*a* from one another.

Similarly, the second half 1101*b* includes three bus bars 126*d*, 126*e*, 126*f* and a conductor 128*b*. As shown, the conductor 128*b* is disposed about the bus bar 126*f*. The bus bars 126*d*, 126*e* are stacked successively and disposed alongside the bus bar 126*f*. The second half 1101*b* also includes three outer sheathing members 124*d*, 124*e*, 124*f* and an inner sheathing member 130*b*. The outer sheathing members 124*d*, 124*e*, 124*f* are configured to insulate the bus bars 126*d*, 126*e* and the conductor 128*b* respectively while the inner sheathing member 130*b* is configured to mutually insulate the bus bar 126*f* and the conductor 128*b* from one another. An interconnect system 1110 connects the first and second halves 1101*a*, 1101*b* to another backbone section. As shown, the interconnect system 1110 includes an interconnect member 1160 that is tiered in shape. The interconnect member 1160 includes multiple stepped portions 1160*a*, 1160*b*, 1160*c*, and 1160*d*.

Figures 12A, 12B, 12C, 12D:
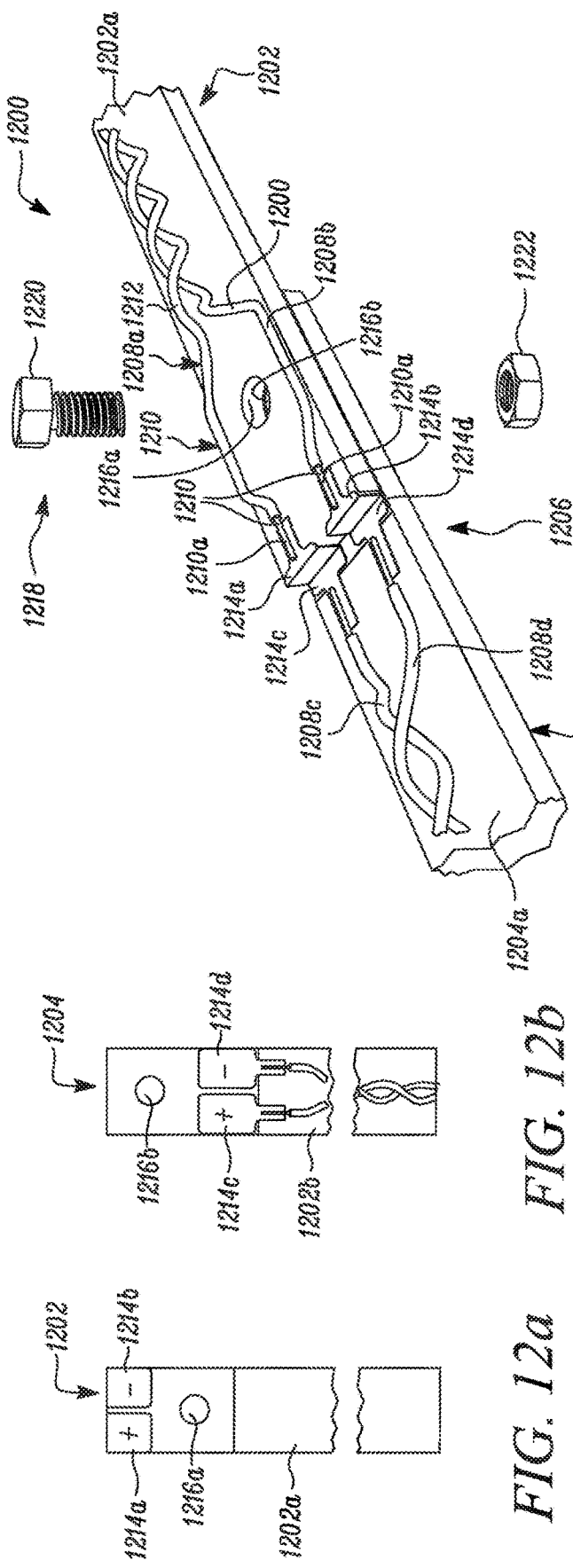
FIGS. 12a-12d illustrate yet another interconnect system according to a certain embodiment of the current invention.

FIGS. 12*a*-12*d* illustrate various components of a backbone 1200 according to certain embodiments. Referring to FIGS. 12*c*-12*d*, the backbone section 1200 includes a first section 1202 and a second section 1204 that are connected to one another. As shown, the first section 1202 includes a first bar 1202*a* and the second section 1204 includes a second bar 1204*a*. Each of these bars 1202*a*, 1204*a* is of a rectangular cross-section. In an embodiment, a backbone section 112 according to any of the embodiments shown in FIGS. 8*a*-8*b*, FIGS. 10*a*-10*b*, and each of the FIGS. 11*e*-11*f* if could be used to form each of the first and second bars 1202*a*, 1202*b* respectively. However, if a backbone section 112 from any of the foregoing embodiments is not required, for instance, when the wiring system 104 is used to only establish power connections between electrical and/or electronic components that are kept apart from one another, then in such cases, the first and second bars 1202*a*, 1202*b* could be made from an electrically non-conductive material. Therefore, depending on specific requirements of an application, one skilled in the art could use the backbone section 112 according to any of the embodiments shown in FIGS. 8*a*-8*b*, FIGS. 10*a*-10*b*, and each of the FIGS. 11*e*-11*f* as the first and second bars 1202*a*, 1202*b* in the backbone 1200, or use electrically non-conductive materials for the first and second bars 1202*a*, 1202*b*. According to the embodiment illustrated in FIGS. 12*a*-12*d*, each of the first and second bars 1202*a*, 1202*b* is made from an electrically non-conductive material.

As shown in FIG. 12*d*, the backbone section 1200 also includes four conductors 1208*a*, 1208*b*, 1208*c*, and 1208*d*. Although four conductors 1208*a*-1208*d* are disclosed, in other configurations of the backbone 1200, the number of conductors 1208 used in the backbone 1200 can vary depending on specific requirements of an application. For example, six conductors may be used—three conductors on each of the bars 1202*a*, 1204*a*. In an exemplary configuration of the backbone 1200 shown in FIG. 12*d*, two of the four conductors 1208*a*, 1208*b* are associated with the first section 1202 while the remaining two conductors 1208*c*, 1208*d* are associated with the second section 1204. Each of these conductors 1208*a*-1208*d* includes an electrical wire 1210 whose end 1210*a* is exposed to an exterior of the associated conductor 1208*a*-1208*d* by stripping-off a portion of an insulating sheathing member 1212 within which the end 1210*a* of the wire 1210 was previously located. Moreover, the insulating sheathing member 1212 associated with wires 1210 of the conductors 1208 could be affixed to associated bars 1202*a*, 1204*a*, for example, by use of an adhesive (not shown).

The backbone 1200 includes an interconnect system 1206. According to this embodiment, the interconnect system 1206 comprises terminals 1214*a*-1214*d* could be soldered to ends 1210*a* of the wires 1210 from respective ones of the conductors 1208*a*-120*d*. As shown, each of these terminals 1214*a*-*d* is formed preferably from thin, stamped sections of metal sheets (for example, metal sheet having thickness in the range of 0.1 millimeter-5 millimeters). Moreover, each of these terminals 1214*a*-*d* could be either laid out on an associated bar (as shown for terminals 1214*c*-1214*d* on the first bar 1202*a* in FIG. 12*a*), or bent over edges bounding an end portion of an associated bar (as shown for the terminals 1214*a*-1214*b* that partially enclose the end portion of the second bar 1202*a* in FIG. 12*b*).

According to an embodiment shown in FIG. 12*d*, the backbone 1200 also comprises holes 1216*a*, 1216*b* that are defined on the bars 1202*a*, 1202*b* of the first and second sections 1202, 1204 respectively. The holes 1216*a*, 1216*b* may be sized and shaped to allow use of a securing arrangement 1218 for securing the bars 1202*a*, 1204*a* of the two sections 1202, 1204, and also to secure the interconnect system 1206 between the bars 1202*a*, 1204*a* of the two sections 1202, 1204 so that the terminals 1214*a*, 1214*b* on the first bar 1202*a* can be maintained in contact with respective ones of the terminals 1214*c*, 1214*d* on the second bar 1204*a*.

To form the backbone 1200, the sections 1202, 1204 are positioned such that the hole 1216*a* on the first bar 1202*a* is in alignment with the hole 1216 on the second bar 1204*a* while the terminals 1214*a*, 1214*b* on the first bar 1202*a* are in abutment with respective ones of the terminals 1214*c*, 1214*d* on the second bar 1202*b* as shown in FIG. 12*d*. The securing arrangement 1218 can then be used to engage with the mutually aligned holes 1216*a*, 1216*b* for securing the first and second bars 1202a, 1204a with one another. According to an embodiment as shown in FIG. 12d, the securing arrangement 1218 includes a bolt 1220 that can be received in the mutually aligned holes 1216a, 1216b of the first and second bars 1202a, 1204a and a nut 1222 that can releasably engage with the bolt 1220. Although, the bolt 1220 and nut 1222 is disclosed herein, it will be appreciated by persons skilled in the art that other types of securing arrangements may be used in lieu of the bolt 1220 and nut 1222 disclosed herein for securing the first and second bars 1202a, 1204a. Therefore, the bolt 1220 and nut 1222 should not to be construed as being limiting of this disclosure. Rather, the terms "securing arrangement" disclosed herein could extend in scope to include other types of arrangements for securing the two bars 1202a, 1204a including, but not limited to, adhesion bonding, soldering, crimping or other methods of securement typically known to persons skilled in the art.

FIG. 13a-13b illustrate exploded and assembled views of interconnect system 1300 according to another embodiment. The interconnect system includes an adapter 1302 that can be used to secure a pair of sections 1304, 1306 carrying conductors 1304a-1304b and 1306a-1306b respectively. The adapter 1302 includes a first portion 1302a that is affixed to the first bar 1304, and a second portion 1302b that is affixed to the second bar 1306. When coupled to one another, the first and second portions 1302a, 1302b could establish a mating joint there between such that the conductors 1304a-1304b on the first section 1304 can be connected to respective ones of the conductors 1306a-1306b on the second section 1306.

Figure 14:
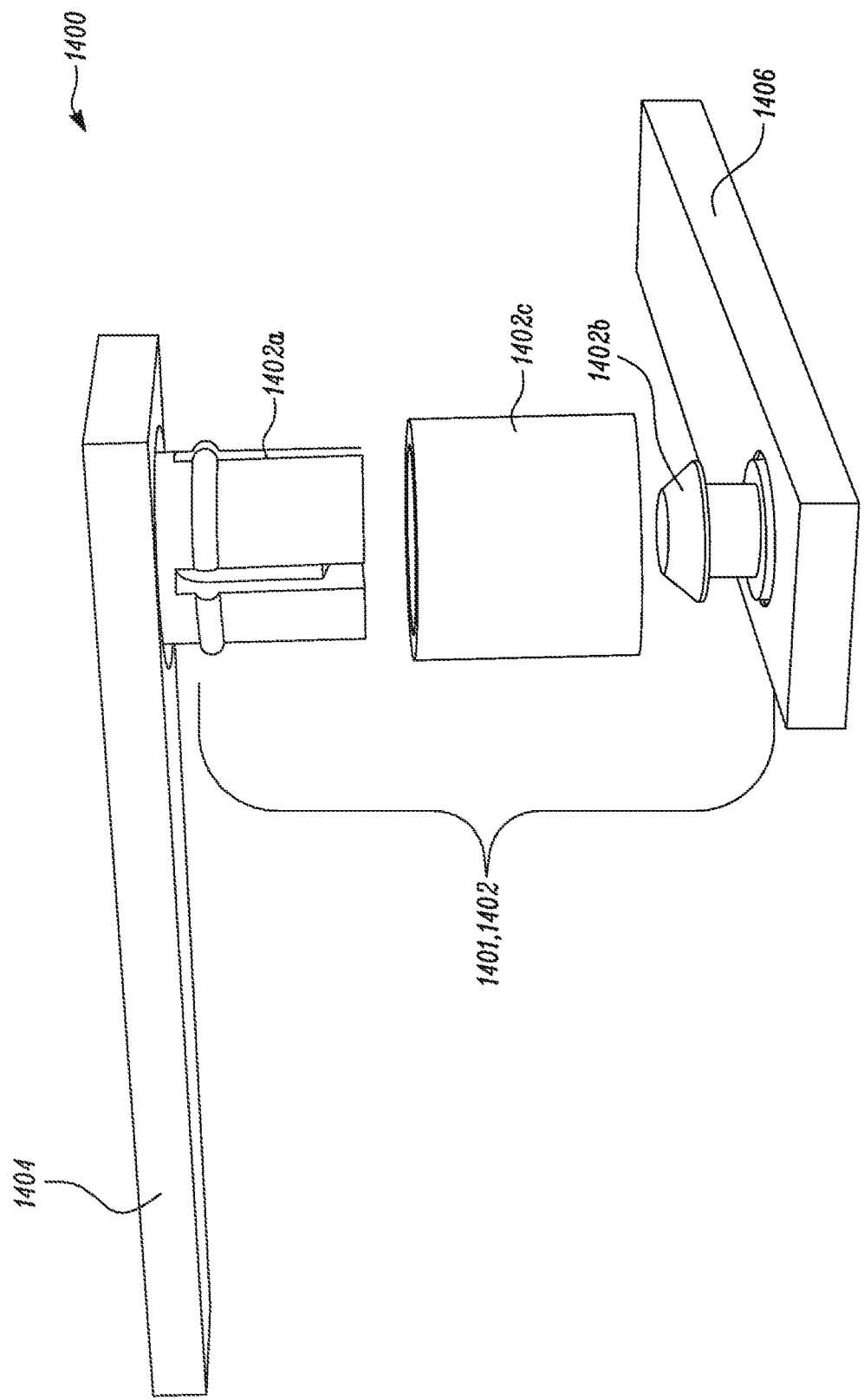
FIG. 14 is an exploded view of a backbone with an interconnect system for connecting a pair of backbone sections according to certain embodiments of the current invention.

FIG. 14 illustrates a backbone 1400 having an interconnect system 1401 that includes an adapter 1402 according to another embodiment. In this embodiment, the adapter 1402 includes a first portion 1402a that is affixed to a first bar 1404 and a second portion 1402b that is affixed to a second bar 1406. The adapter 1402 also includes an intermediate portion 1402c which is configured to engage with each of the first and second portions 1402a, 1402b respectively.

Figures 15A, 15B:
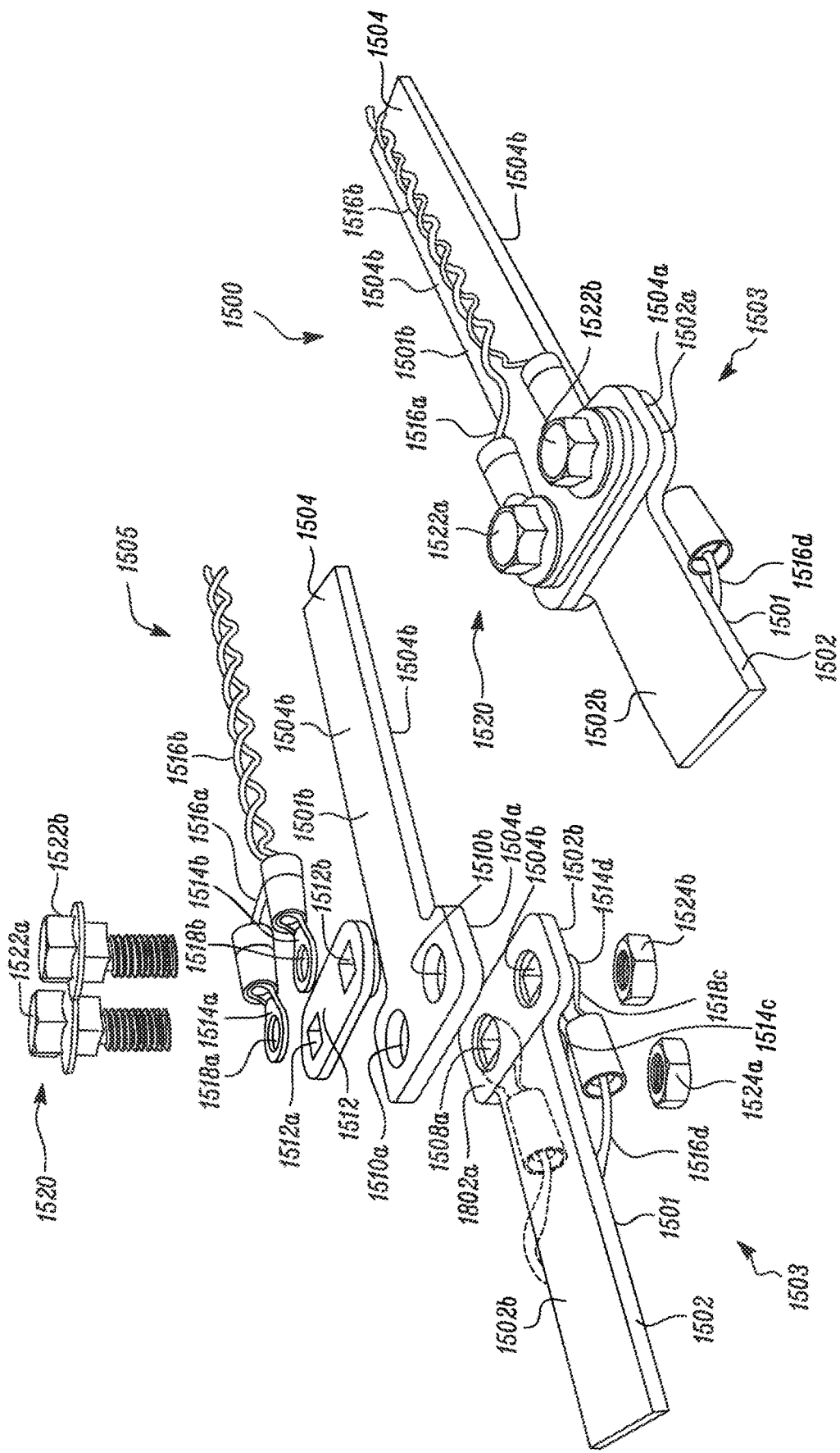
FIGS. 15a-15b illustrate exploded and assembled views of a wiring system, according to certain embodiments of the current invention.

Referring to FIGS. 15a-15b, a backbone 1500 according to another embodiment. A first bar 1502 is configured to define a conducting surface 1502a that is disposed on an end portion of the first bus bar 1502, and a non-conducting surface 1502b that is located on a remnant portion of the first bus bar 1502. Similarly, a second bus bar 1504 is configured to define a conducting surface 1504a that is disposed on an end portion of the second bus bar 1504, and a non-conducting surface 1504b that is located on a remnant portion of the second bus bar 1504. The non-conducting surfaces 1502b, 1504b of the first and second bus bars 1502, 1504 may be obtained by coating the portions remnant or exclusive of the conducting portions 1502a, 1504c from the respective bus bars 1502, 1504 with an electrically insulating layer of material/s commonly known to persons skilled in the art. Exemplary material/s include silicone polyethylene complex polymers, which can be malleable as well as retain form, homopolymer high density polyethylene (HDPE), which can achieve good plastic deformation retention, or another polymer. To form specific bends and geometries, localized heat may be used to thermoplastically deform the polymer as long as they may be formed or deformed for covering the desired structure of the associated bus bar 1502, 1504.

The first bus bar 1502 includes a first pair of holes 1508a, 1508b while the second bus bar 1504 is configured to define a second pair of holes 1510a, 1510b that correspond to respective ones of the first pair of holes 1508a, 1508b of the first bus bar 1502. Each hole from the first pair of holes 1508a, 1508b extends from the conducting surface 1502a to the non-conducting surface 1502b located on an opposing side 1501a to the conducting surface 1502a of the first bus bar 1502. Likewise, each hole from the second pair of holes 1510a, 1510b extends from the conducting surface 1504a to the non-conducting surface 1504b located on an opposing side 1501b to the conducting surface 1504a of the second bus bar 1504. As best shown in FIG. 15b, when the first and second bus bars 1202, 1204 are assembled to form the backbone 1500, the conducting surfaces 1502a, 1504a from the first and second bus bars 1502, 1504 are positioned in abutment with one another while the first pair of holes 1508a, 1508b are positioned in alignment with the second pair of holes 1510a, 1510b.

Additionally, a di-electric spacer 1512 containing a pair of holes 1512a, 1512b is provided. As shown, the holes from this di-electric spacer 1512 is in alignment with the pairs of mutually aligned holes 1508a, 1510a and 1508b, 1510b from the first and second bars 1502 and 1504 respectively. A first pair of terminals 1514a, 1514b are disposed on the di-electric spacer 1512. A second pair of terminals 1514c, 1514d is disposed on the non-conducting surface 1502b of the first bar 1502. The terminals 1514a-1514d are configured to be coupled to corresponding ones of conductors 1516a-1516d disposed on the non-conducting surface 1502b of the first bar. Each terminal 1514a-1514d has a hole 1518a-1518d that is disposed in mutual alignment with the holes 1508a, 1510a and 1508b, 1510b from respective ones of the first and second bars 1502, 1504 and the holes 1512a, 1512b of the di-electric spacer 1512 respectively. This way, a pair of securing arrangements 1520 comprising a pair of bolts 1522a-1522b can be received within the mutually aligned holes 1508a, 1510a, 1512a, 1518a and 1508b, 1510b, 1512b, 1518b from respective ones of the first bar 1502, the second bar 1504, the di-electric spacer 1512 and corresponding pairs of terminals 1514a-1514d. The securing arrangements 1520 also include a pair of nuts 1524a-1524b corresponding to the pair of bolts 1522a-1522b and can releasably engage with the pair of bolts 1522a-1522b to secure a first section 1503 and a second section 1505 of the backbone 1500.

Figure 16:
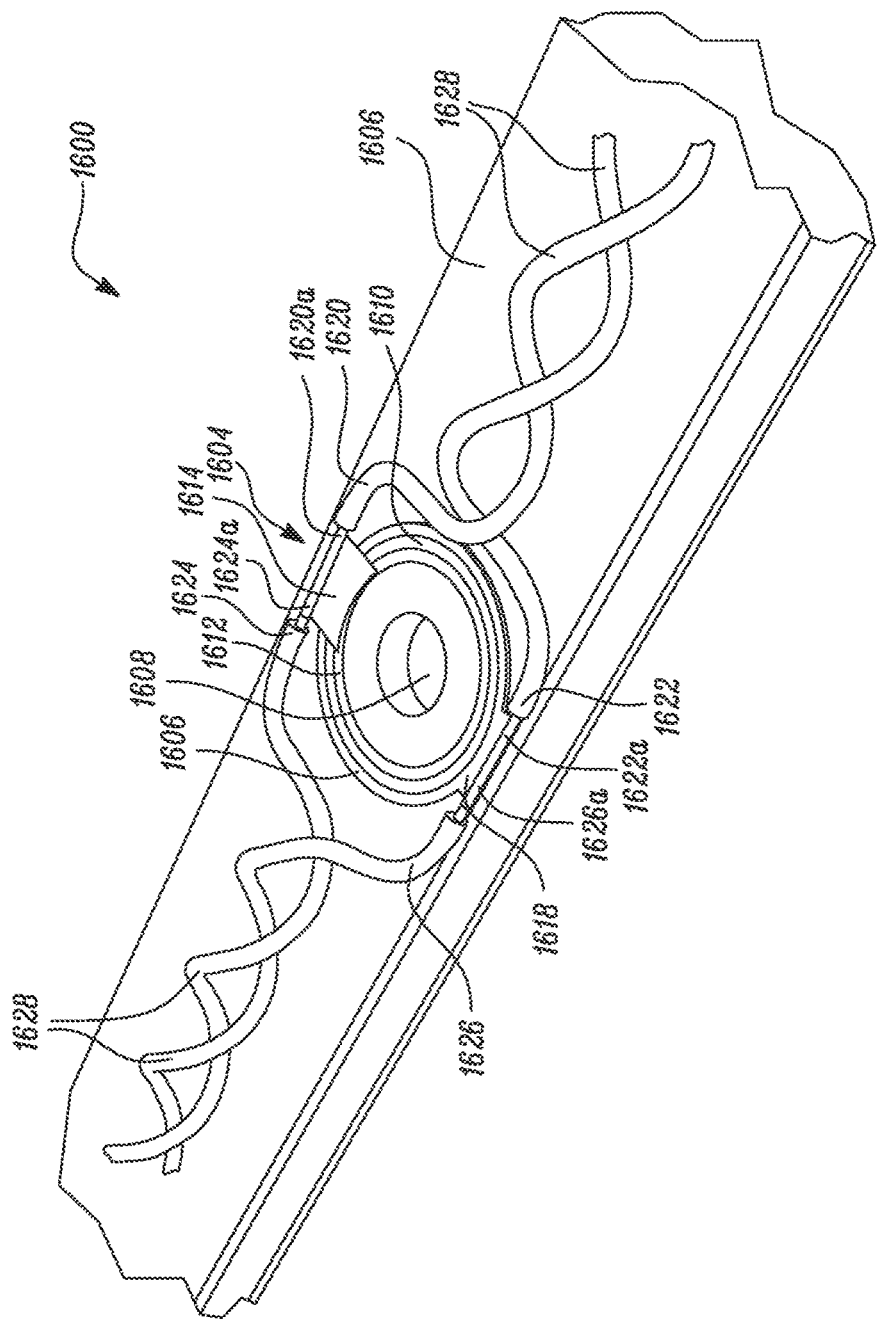
FIG. 16 illustrates a backbone section with a compound washer according to a certain embodiment of the current invention.

FIG. 16 illustrates a backbone section 1600 and a compound washer 1604 according to an embodiment. The backbone section 1600 includes a bar 1606 that is configured to define a cut-out portion 1608 therein. The compound washer 1604 is disposed on the bar 1606 and located about the cut-out portion 1608. The compound washer 1604 is adhered to the bar 1606 with an insulating adhesive. The compound washer 604 is configured to include a di-electric base 1610. A first ring washer 1612 is disposed on an inner circumference of the di-electric base 1610 and configured to define a first terminal 1614. A second ring washer 1616 is concentrically disposed about the di-electric base 1610 and is hence, located in a spaced-apart relation to the first ring washer 1612. The di-electric base 1610 is configured to electrically insulate the first and second ring washers 1612, 1616 from one another. The second ring washer 1616 is configured to define a second terminal 1618.

End portions 1620a, 1622a of a pair of conductors 1620, 1622 may be soldered or welded to the first and second terminals 1614, 1618 respectively. Similarly, end portions 1624a, 1626a of another pair of conductors 1624, 1626 may be soldered or welded to the first and second terminals 1614, 1618 respectively. Therefore, the pair of conductors 1620, 1622 are connected to the pair of conductors 1624, 1626 with the help of the terminals 1614, 1618 vis-a-vis the corresponding pairs of end portions 1620a, 1622a and 1624a, 1626a from the pairs of conductors 1620, 1622 and 1624, 1626 respectively. Each of the conductors 1620, 1622, 1624, 1626 also include an insulating sheathing member 1628 that can be affixed to the bar 1606, for example, using an adhesive.

FIG. 17a illustrates a compound washer 1704 according to an embodiment. According to this embodiment, the compound washer 1704 includes an annular di-electric base 1706 that is disposed about a cut-out portion 1708 of a bar 1702 and affixed to the bar 1702, for example, with the help of an adhesive. A first arcuate washer 1712 is disposed on the annular base 1706 and is configured to define a first terminal 1714. A second arcuate washer 1716 is disposed on the annular base 1706 and located in a spaced-apart relation to the first arcuate washer 1712. The second arcuate washer 1716 is configured to define a second terminal 1718.

Referring to FIGS. 17b and 17c, end portions 1720a, 1722a of a pair of conductors 1720, 1722 could be soldered to the first and second terminals 1714, 1718 respectively. Similarly, end portions 1724a, 1726a of another pair of conductors 1724, 1726 could be soldered to the first and second terminals 1714, 1718 respectively. Therefore, the pair of conductors 1720, 1722 are connected to the pair of conductors 1724, 1726 with the help of the terminals 1714, 1718 vis-a-vis the corresponding pairs of end portions 1720a, 1722a and 1724a, 1726a from the pairs of conductors 1720, 1722 and 1724, 1726 respectively. Each of the conductors 1720, 1722, 1724, 1726 also include an insulating sheathing member 1728 that can be affixed to the bar 1706, for example, using an adhesive.

As shown in FIG. 17b, the backbone section 1700 may include a flex plate 1728 having a pair of conducting portions 1728, 1730 that are configured to correspond with the pair of terminals 1714, 1718 provided on the compound washer 1704 respectively. The pair of conducting portions 1714, 1718 on the flex plate 1728 is adapted to tap power from the pair of terminals 1714, 1718 and route such tapped power in a direction D laterally away from a longitudinal axis AA' of the bar 1702. In this embodiment, the backbone section 1700 would additionally include a Belleville washer 1734 and a bolt 1736 for securing the flex plate 1728 to the bar 1702.

Preferentially, the backbone is as continuous as possible to ensure that that as few discontinuities (such as an impedance discontinuity) exist. In certain embodiments, the backbone extends from the battery 180 in continuous segments. For example, as shown in FIG. 1b, two of segments 112 are implemented as backbone to backbone connections while four segments 112 may be used without any backbone to backbone connections, only backbone-to-battery connections.

Windowing and Backbone Connector

Figure 18A:
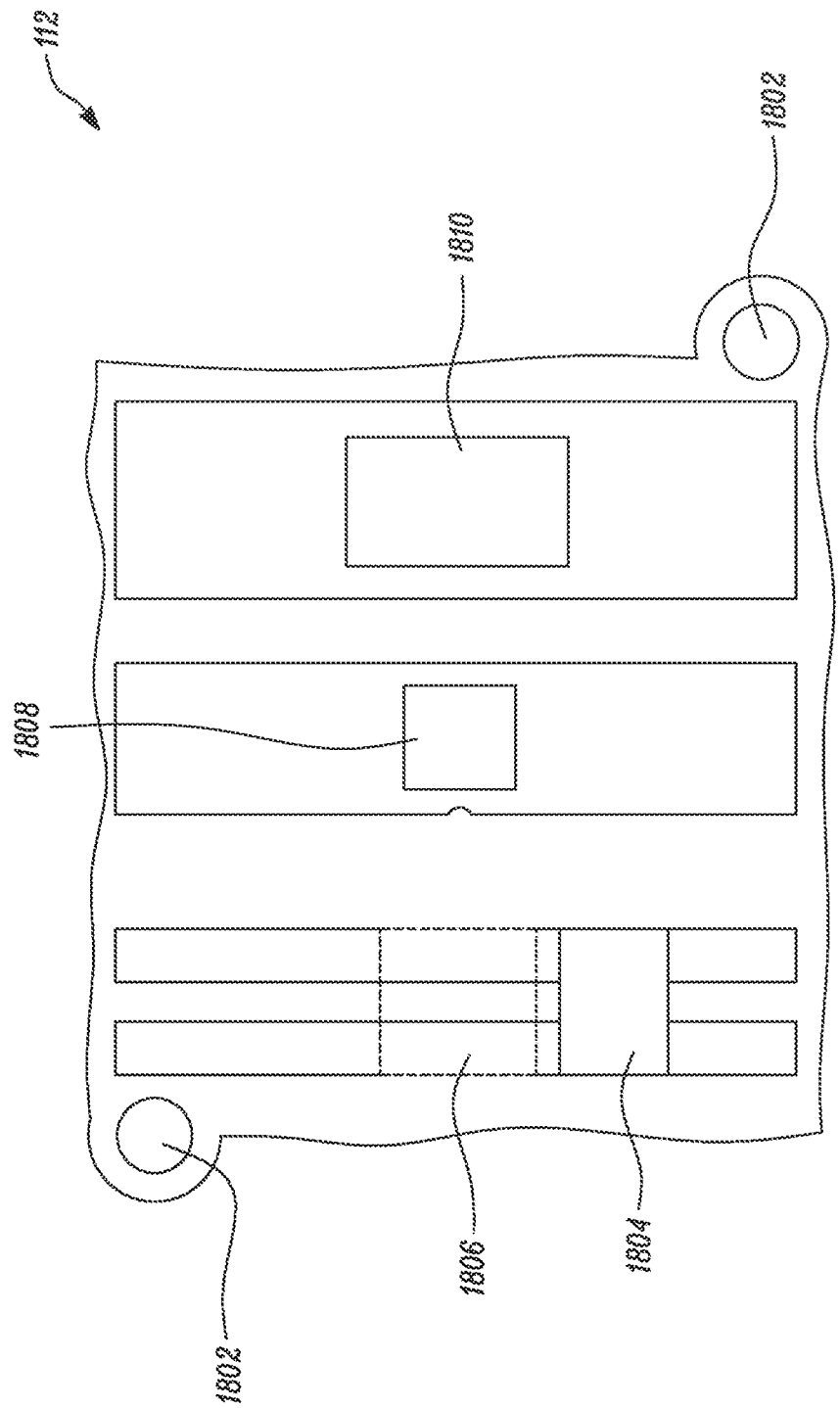
FIG. 18a illustrates a backbone section with windowed regions to make a connection to another cable according to certain embodiments of the current invention.

When backbone 112 is not formed of multiple preformed segments connected to one another, tap-off or branch-off connections to the backbone must be made in another fashion. FIG. 18a illustrates a view of a backbone cable 112 that has been windowed (pocketed on one face) to allow for the connection of the backbone cable 112 to another cable (not shown), such as an umbilical cable 184 (see FIG. 1b), at a location along the backbone 112 other than the end of the backbone 112.

As shown in FIG. 18a, windows have been formed by removing the outer sheathing and any other necessary layers to expose the desired layer. The 2D layout of windows may differ from that shown in FIG. 18a. FIG. 18a shows a trace window 1806 that exposes conductors, such as conductors 128c and 128d shown in FIG. 6a or FIG. 7. When creating this window, not only must the outer sheathing be removed, but also any inner sheathing and shielding layers also be removed to expose the conductors and remove any residual sheathing or adhesive residues. Shielding window 1804 is formed by removing the layers above the shielding layer. In certain embodiments, only the outer sheathing layer must be removed. Conductor windows 1808 and 1810 are similarly formed by removing the material above the conductors to expose them. For example, conductors 128a and 128b as shown in FIGS. 6a and 7 are exposed by removing part of shielding layer 132, part of inner sheathing material 130a, and part of outer sheathing material 140. The outer sheathing material, which is removed to create the windows, may be PE, PP, PET, PEN, PI, another insulating material, or another polymer material. The inner sheathing material may be PE, PP, PET, PEN, PI, another insulating material, or another polymer material. As shown in FIG. 18a, the backbone 112 contains alignment holes 1802 near the area where the connection to the backbone 112 is going to be made i.e., proximal to a location of the windows 1804, 1806, 1808 and 1810. In an embodiment as shown in FIG. 18a, two alignment holes 1802 are made. However, in some embodiments, fewer or more alignment holes 1802 may be present in varying shapes and sizes, while in other embodiments, no alignment holes may be defined.

The exposed conductors 128a-d and shielding layer 132 from the backbone cable 112, may be connected to another backbone cable, such as an umbilical cable 184 via a connector, such as a backbone connector 190 as shown in FIG. 2. Because one or more of the conductors may be communication lines running next to a DC power line, transmitting at for example 48V, the communication lines and consequently, the backbone connector 190 should be shielded. In embodiments, the assembled backbone connector 190 meets IP67 ingress protection. In embodiments, the assembled backbone connector 190 provides shielding of up to 40 dB for electromagnetic interference (EMI) at frequencies up to 100 MHz. In other embodiments, the assembled backbone connector 190 provides shielding of up to 60 dB for EMI at frequencies between 100 MHz and 500 MHz.

Figure 18B:
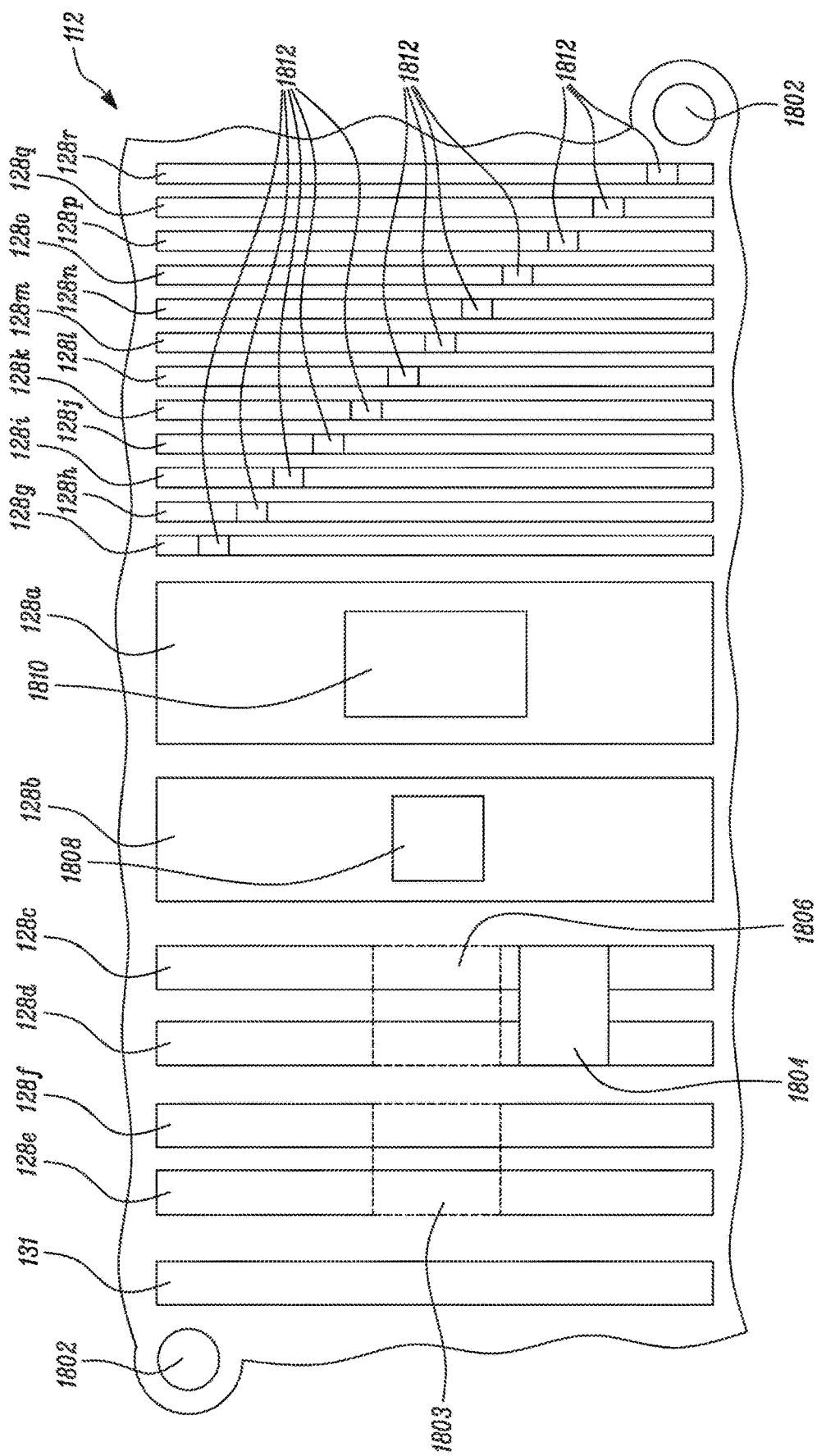
FIG. 18b illustrates an umbilical cable with windowed regions to make a connection to the backbone section or another cable, via the PCBA, according to certain embodiments of the current invention.

FIG. 18b illustrates windowed regions on various conductors that are included in the backbone section 112 of FIG. 6c. As shown, trace window 1803 is created by removing a portion of the outer sheathing member 140 (refer to FIG. 6c) to expose the conductive shield member 131 associated with the set of conductors 128e-f. Similarly, trace window 1806 is created by removing a portion of the outer sheathing member 140 to expose the conductive shield member 131 associated with the set of conductors 128c-d. Trace window 1804 is created by removing adjoining portions from the outer sheathing member 140, the conductive shield member 131, and the inner sheathing member 130a to expose conductors 128c-d. Trace windows 1808, 1810, 1812 are created by removing of a portion of the outer sheathing member 140 adjacent to each of conductors 128a, 128b, and 128g-r, so that the set of conductors 128a, 128b, and 128g-r are exposed. The exposed portions of each of conductors 128a-r and the conductive shield member 131 associated with the conductors 128e-f are then connected with the backbone section 112, for example via the PCBA 196 according to certain embodiments, such as those shown in FIGS. 19a-d. In embodiments, the exposed conductors and shielding are directly connected to corresponding conductors or shielding in an umbilical cable 184. In certain embodiments, when umbilical cable 184 has fewer conductors than the backbone section 112, then a window (and subsequent connection) need to be created. For example, if umbilical cable 184 only has two of conductors 128g-r (specifically, conductors 128g-h), then only two trace windows 1812, those exposing conductors 128g-h, need be created, and subsequently, only conductors 128g-h in the backbone section are connected to conductors 128g-h in the umbilical cable 184.

In embodiments the size of the window (width and height of the exposed conductors or shielding) varies depending on the width of the underlying conductors or underlying conductive shield member 131. Further, as shown in FIG. 18b windows may be offset from one another to facilitate connection to the underlying conductor or shielding. This decreases the possibility that two or more conductors, for example 128g-r) will inadvertently connect, creating a short. While adjacent windows 1312 are shown in FIG. 18b to be offset from one another, this offset may not be required, for example, when the PCBA 196.

FIG. 19a shows an exploded view of the backbone connector 190 according to certain embodiments of the current invention and FIG. 19b shows the same connector 190 closed, connecting a backbone section 112 to an umbilical cable 184. As shown in FIG. 19a, the backbone connector 190 has a base plate 192 that may be formed via plastic injection molding or another molding technique. Base plate 192 may be formed from PE, PP, PET, PBT, Nylon or another polymer. In other embodiments, base plate 192 is a formed of a metallic or a ceramic material. Backbone connector 190 has posts 198 protruding from the base plate 192. These posts 198 may not be part of the mold, but may be externally attached as a secondary operation. They may also help align backbone section 112. The other side of backbone connector 190 is PCBA 196, which is connected to umbilical cable 184. PCBA 196 and umbilical cable 184 may be hot bar soldered, laser or ultrasonically soldered, adhered using an adhesive, or connected via another method such as Anisotropically Conductive Films or Pastes (ACFs or ACPs). Excluding connectors is desirable from a cost perspective since it removes a connector, driving down cost. PCBA 196 also preferentially has alignment holes that are configured to accept posts 198 for alignment and retention purposes. The addition of nuts 199 forms the backbone connector 190 and allows for an electrical connection to be made from the backbone section 112 to the umbilical cable 184 when the backbone connector 190 is closed as shown in FIG. 19b. Torque resulting from a tightening of the nuts 199 with the posts 198 also allows for a proper seal to the exposed windows using ingress protector 194. The seal prevents dust and water from entering into the backbone connector 190, whether through leak paths along the nuts 199 or along the edges of the base plate 192, and shorting any connections or otherwise decreasing lifetime. In embodiments, the PCBA 196 routes data signals and the desired amount of voltage to the appropriate location.

Figure 19D:
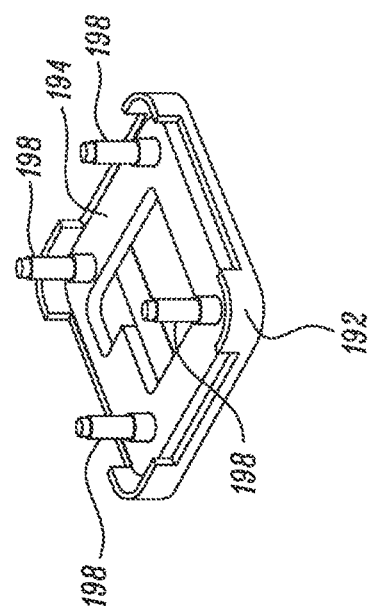
Figure 19C:
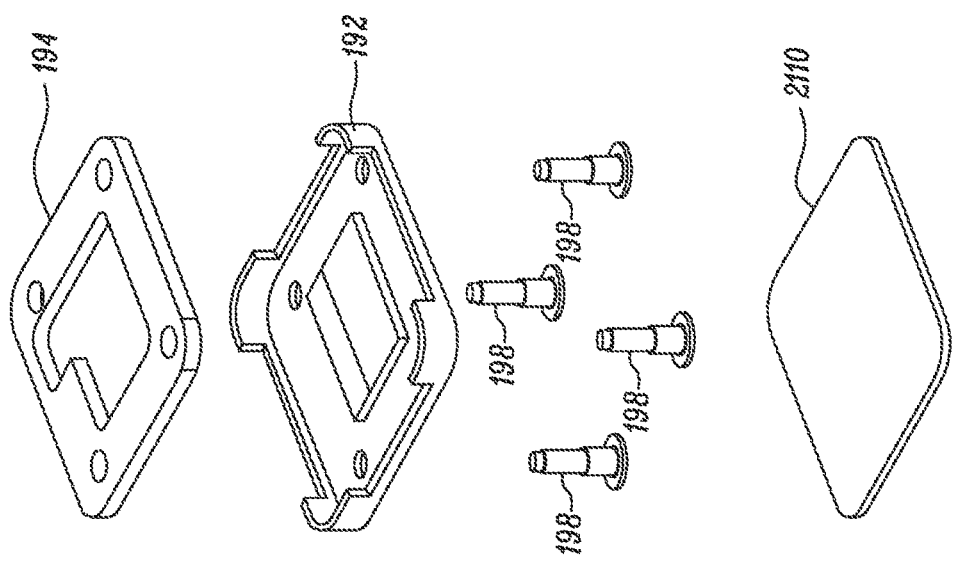

In certain embodiments, posts 198 are part of the base plate 192 and molded together as one part. In other embodiments, the posts 198 are separate from the base plate 192, as shown in FIG. 19c. FIG. 19c also shows a mounting adhesive 2110 affixed to a rear of the base plate 192, according to certain embodiments. Mounting adhesive 2110 allows for the backbone connector 190 to be affixed to a desired location, such as a specific location in a vehicle. Mounting adhesive 2110 may be of acrylic, epoxy, or silicone types, or hybrid adhesives of complex formulations. FIG. 19d shows part of the assembled backbone connector 190 with separate posts 198 (that is posts 198 that are not integrally formed with the base plate 192 as shown in FIG. 19c) and ingress protector 194 positioned on top of the base plate 192.

Figure 20B:
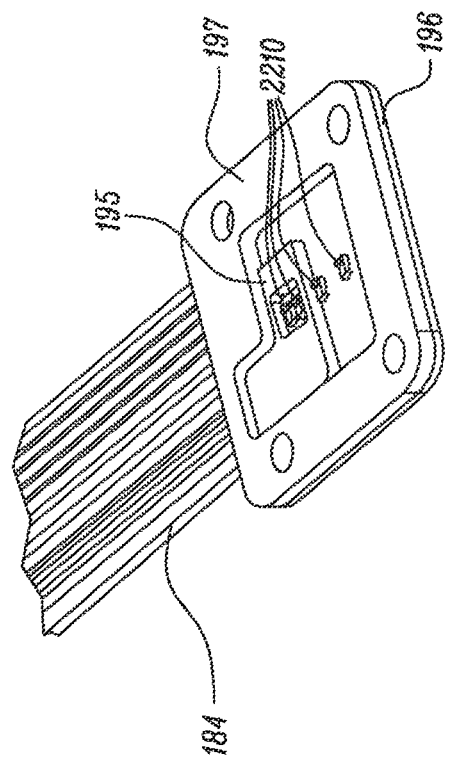
FIGS. 20a-b illustrate the backbone connector according to certain embodiments of the current invention.
Figure 20A:
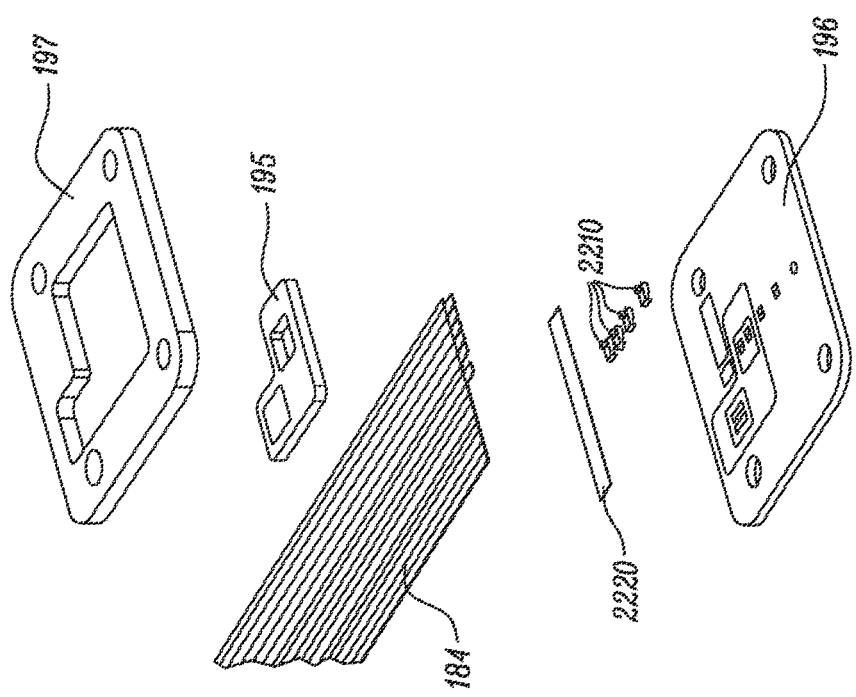

In embodiments, spring fingers 2210 are affixed to the PCBA 196 as shown in the exploded view of FIG. 20a and the non-exploded view of FIG. 20b. Spring fingers 2210 may be of Copper (Cu) or Aluminum (Al) and may be plated with tin (Sn), nickel (Ni), gold (Au), or another conductive material. In other embodiments, spring fingers 2210 may be replaced with Pogo pins (not shown) or other element with a similar "face-contact" mechanism. Also shown in FIG. 20a is (1) adhesive seal 2220 that helps adhere the umbilical cable 184 to the PCBA 196, (2) EMI shield gasket 195 that helps shield conductors used to transmit data signals, such as conductors 128c and 128d shown in FIGS. 6a and 7, and (3) gasket seal 197, which helps prevent any dust or water vapor from entering and shorting out the electrical connections. EMI shield gasket 195 may be made of a metal foam, a conductive polymer, or another material (preferably conductive) that shields certain conductors carrying data signals from electrical noise. Additionally, the PCBA 196 may have passive or active electrical components (such as MOSFETS, resistors, op-amps, or microcontrollers) for added performance and control. Consequently, heat sinks (not shown) and other thermal dissipation means may also become part of the backbone connector 190.

Figure 21:
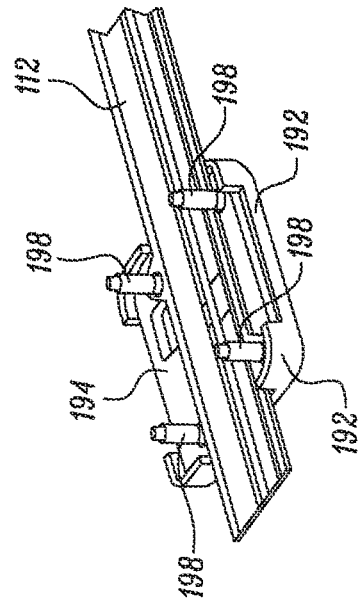
FIG. 21-24 illustrates the installation procedure of connecting a backbone section to an umbilical cable using a backbone connector according to an embodiment of the current invention.
Figure 22:
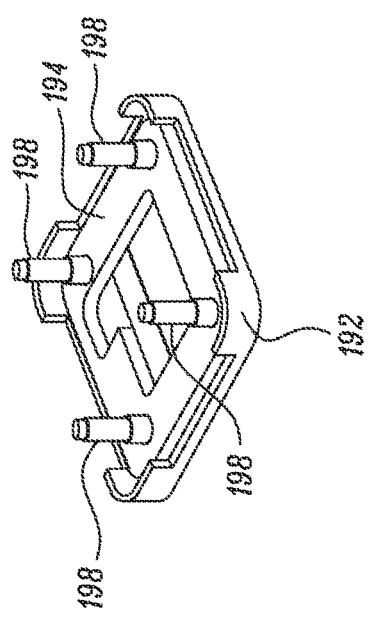
Figure 24:
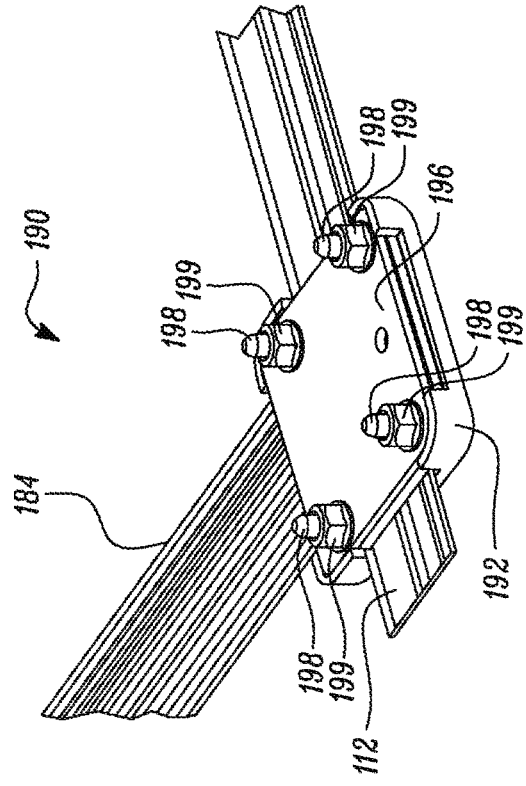
Figure 23:
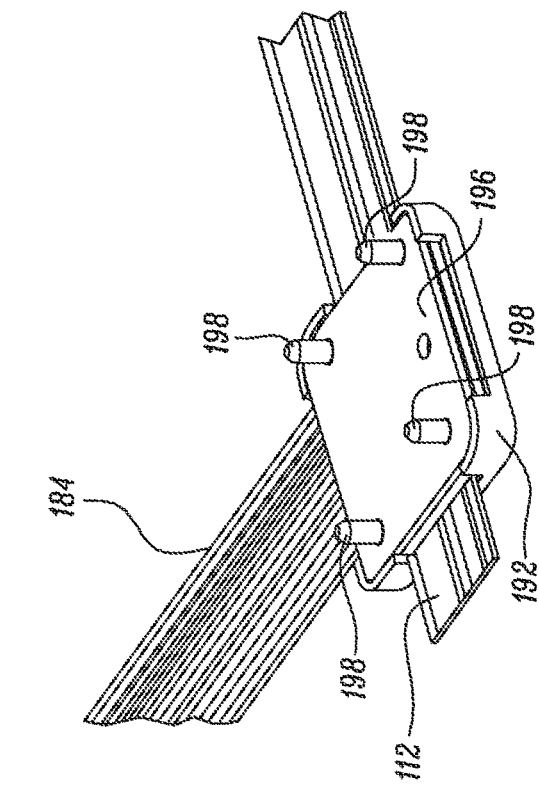
Figure 25:
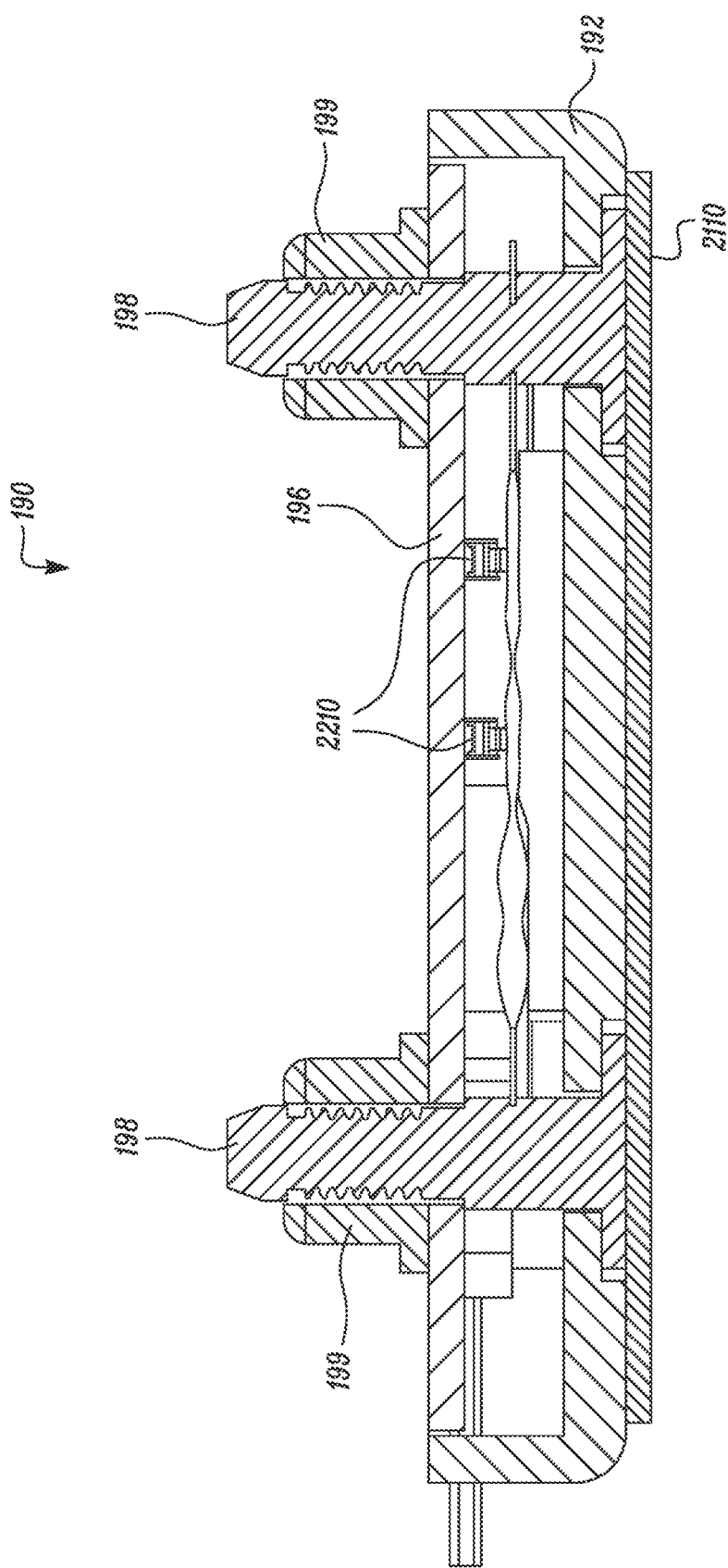
FIG. 25 illustrates a cross section view of the backbone connector according to an embodiment of the current invention.

FIGS. 21-24 illustrate the installation procedure of connecting a backbone section 112 to an umbilical cable 184 using a backbone connector 190 according to an embodiment of the current invention. As shown in FIG. 21, base plate 192 with posts 198 is installed in the vehicle (using adhesive or otherwise). As shown in FIG. 22, backbone section 112 is installed over the posts 198. Alternatively, backbone section 112 could have already have been joined to base plate 192 with posts 198 prior to base plate 192 being installed onto vehicle. As shown in FIG. 23, the PCBA 196 with attached umbilical cable 184 is aligned over posts 198. In certain embodiments, the PCBA 196 includes spring fingers 2210, EMI shield gasket 195 and gasket seal 197 as shown in FIGS. 20a-20b. Referring now to FIG. 24, nuts 199 are attached to secure the PCBA 196 to the base plate 192 and form the electrical connections between backbone 112 and umbilical cable 184. FIG. 25 illustrates a cross section view of the backbone connector 190 according to an embodiment of the current invention. Spring fingers 2210, base plate 192, posts 198, nuts 199, PCBA 196, and other components are shown.

Figure 26:
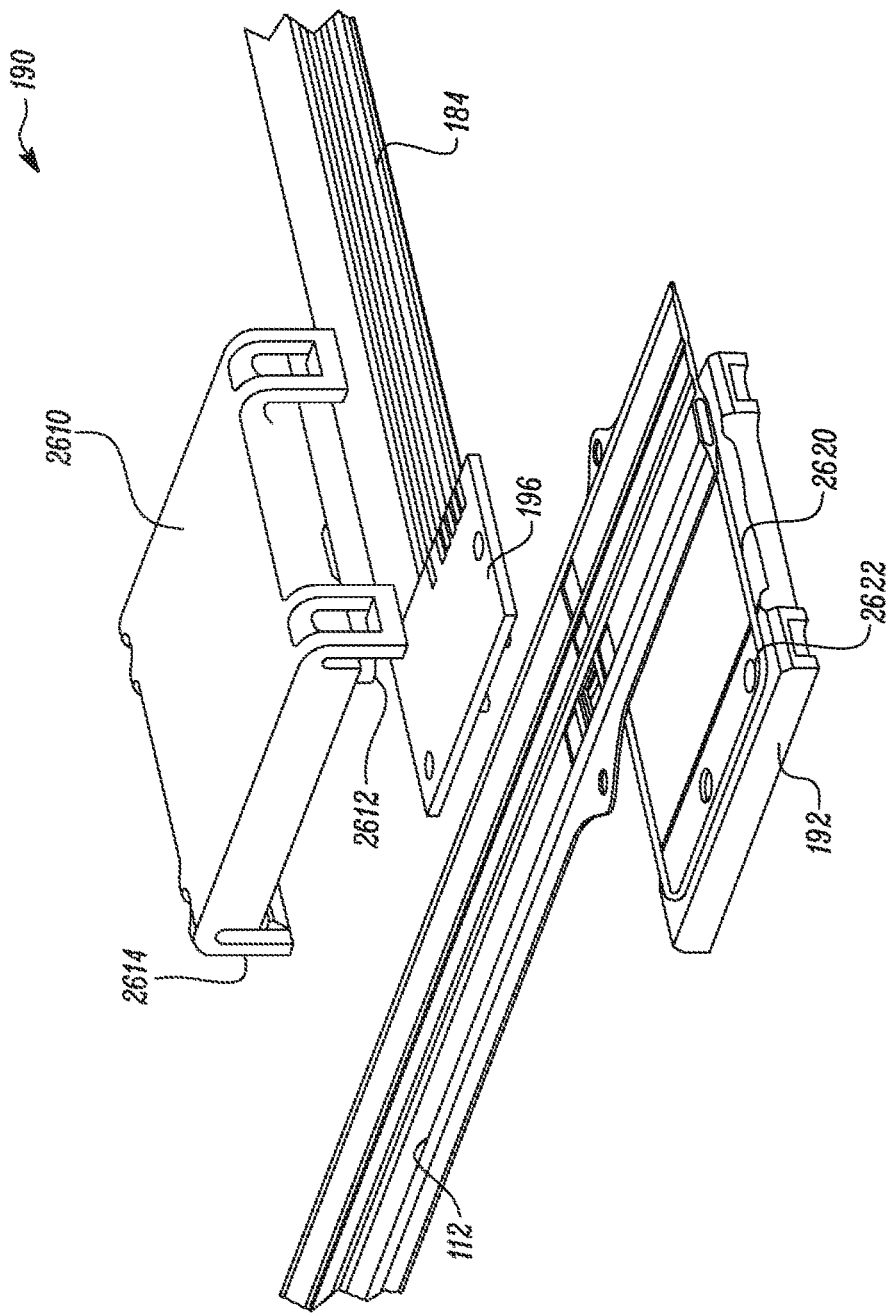
FIGS. 26-28 illustrate the backbone connector according to certain embodiments of the current invention.
Figure 27:
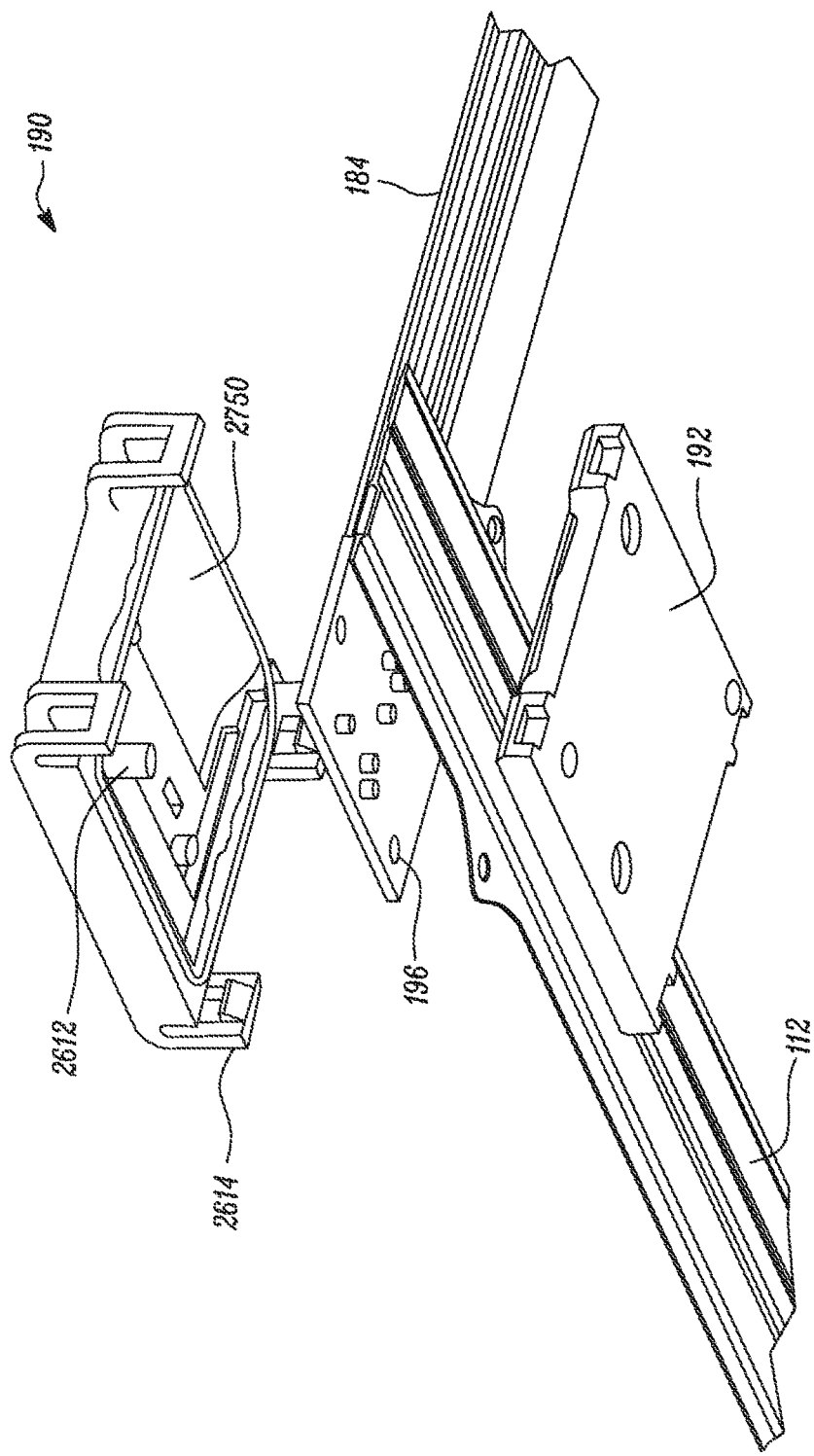
Figure 28:
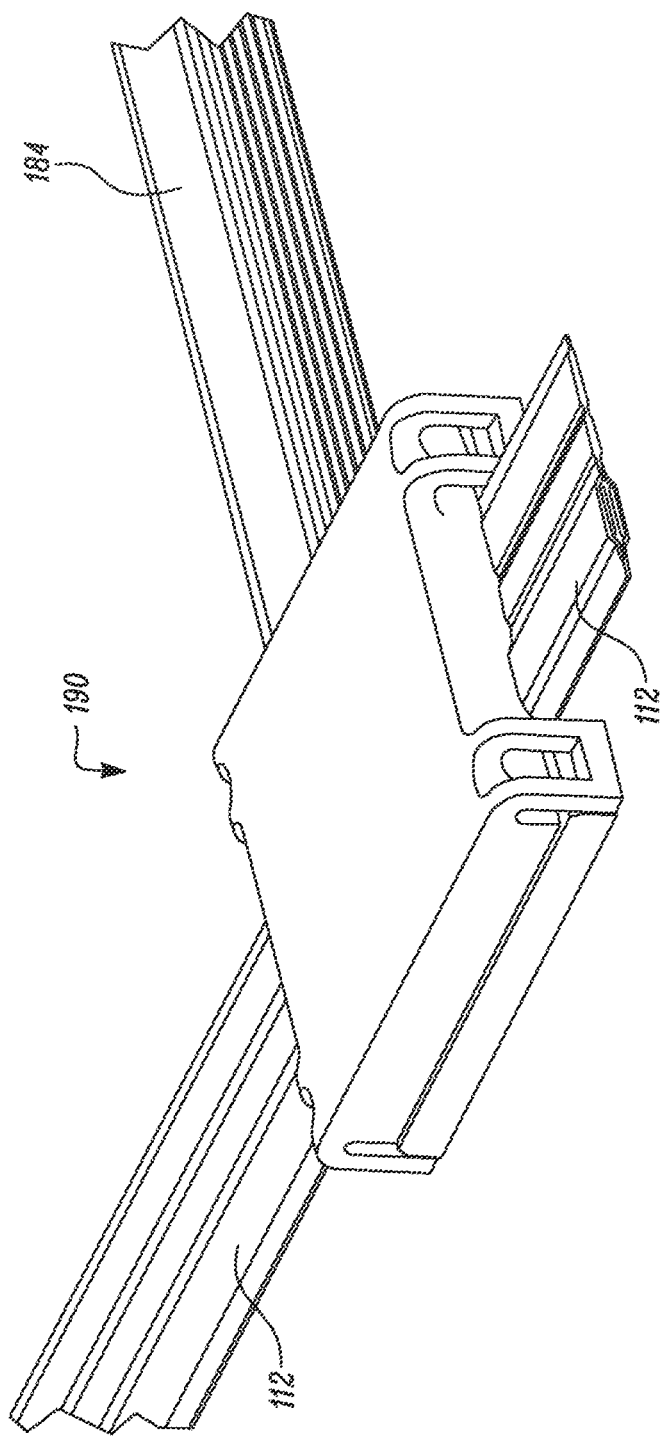

FIGS. 26-28 illustrate another embodiment of the backbone connector 190. FIGS. 26 and 27 show an exploded view of the backbone connector 190. Base plate 192 has a conductive gasket 2620 that when closed helps seal the backbone connector 190 from the environment, including dust and water vapor, as well as provide shielding from EMI for frequencies between 100 MHz to 500 MHz. In certain embodiments, the assembled backbone connector 190 meets IP67 ingress protection. Upper cover 2610 has snap hooks 2614 and pins 2612. Pins 2612 help align the backbone section 112 and umbilical cable 184 that is connected to PCBA 196, as well as the upper cover 2610 with the base plate 192. Upper cover 2610 may contain a conductive surface 2750 on the inside, such as a metal or conductive polymer coating. In other embodiments, the outside of the upper cover 2610 is the conductive surface or the upper cover 2610 is made from a conductive material, such as a metal, conductive polymer, or insulating material dispersed with metal particles (such as silver nanoparticles or Al deposition using vacuum metallization). In certain embodiments, upper cover 2610 is molded. Base plate 192 may also contain a conductive surface on the top side, such as a metal or conductive polymer coating. In other embodiments, the bottom of the base plate 192 is the conductive surface or the base plate 192 is made from a conductive material, such as a metal, conductive polymer, or insulating material dispersed with metal particles (such as silver nanoparticles). In certain embodiments, base plate 192 is molded. FIG. 28 shows the backbone connector 190 fully assembled connecting backbone section 112 to umbilical cable 184. In embodiments, the PCBA 196 routes data signals and the desired amount of voltage to the appropriate location and may contain active or passive electrical components (such as MOSFETS, resistors, op-amps, or microcontrollers)

Figure 29:
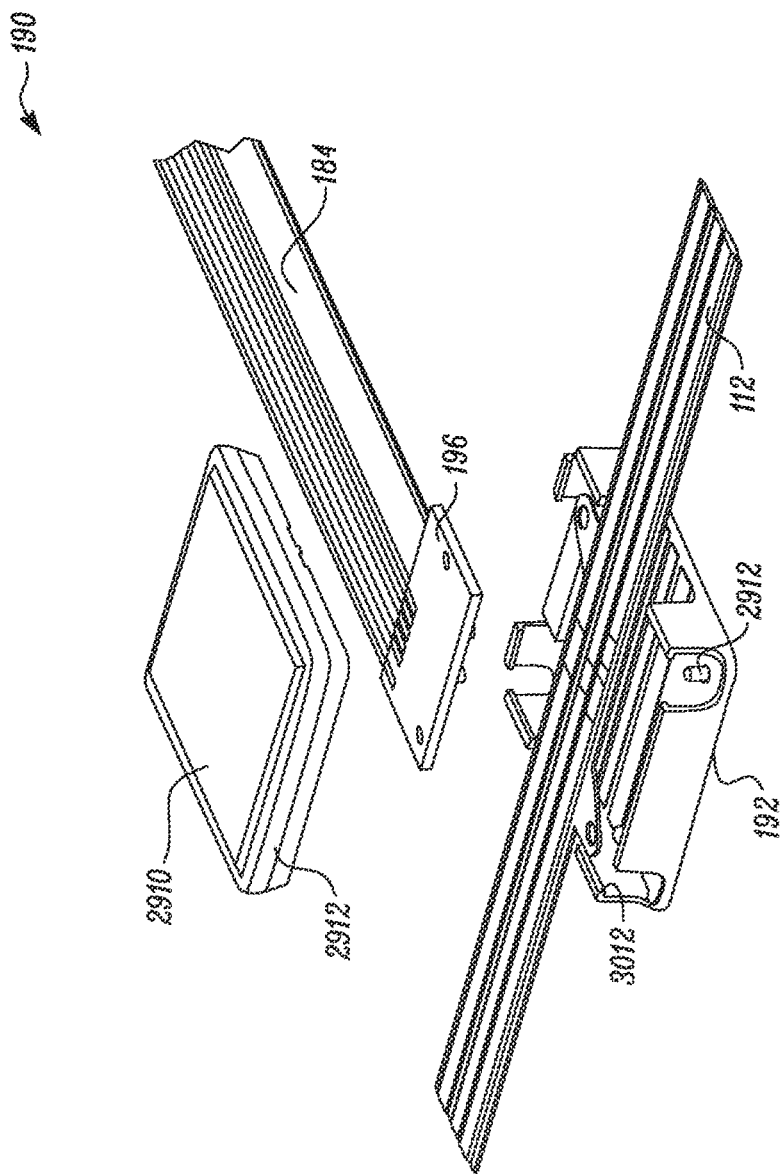
FIGS. 29-31 illustrate the backbone connector according to certain embodiments of the current invention.
Figure 30:
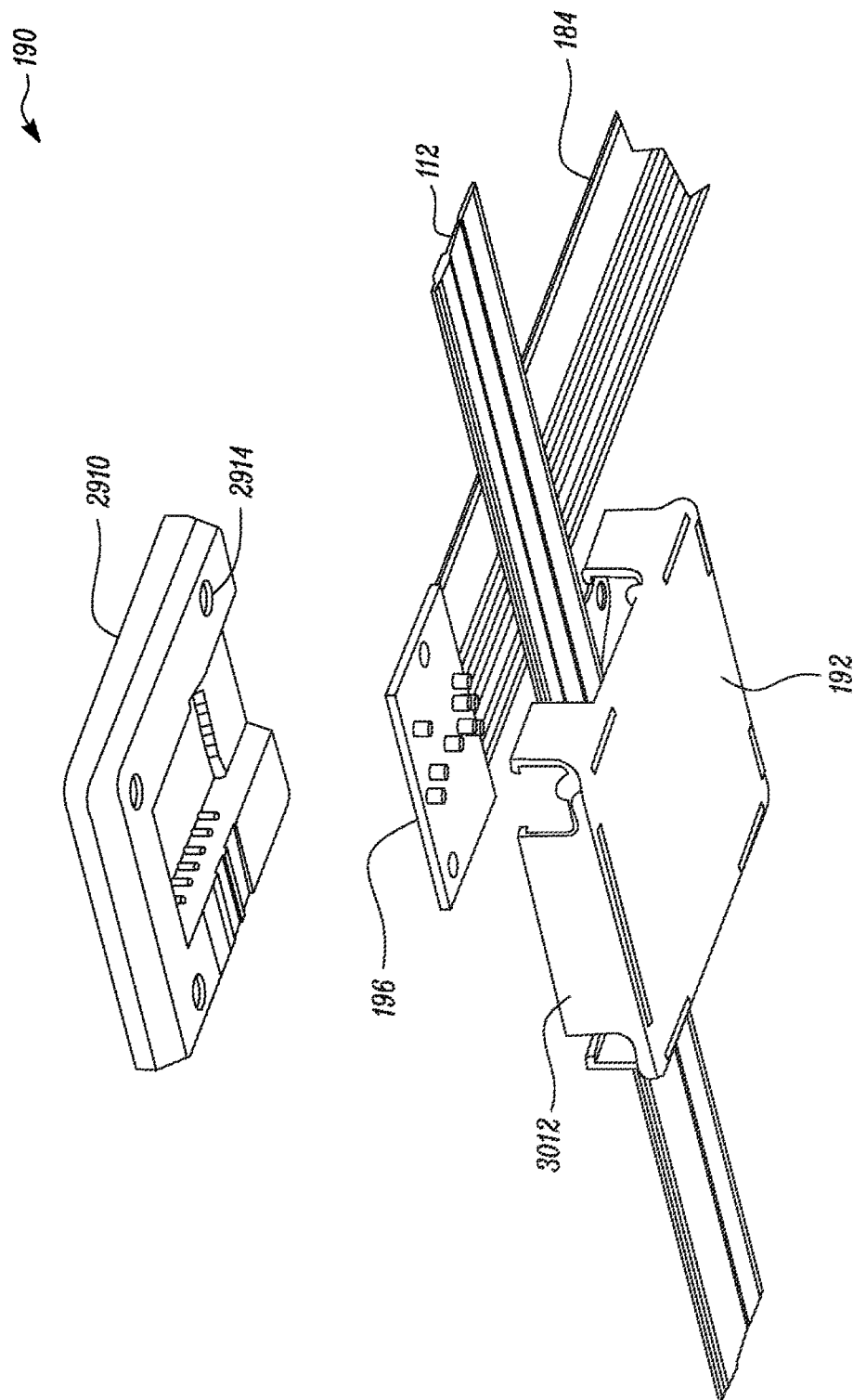
Figure 31:
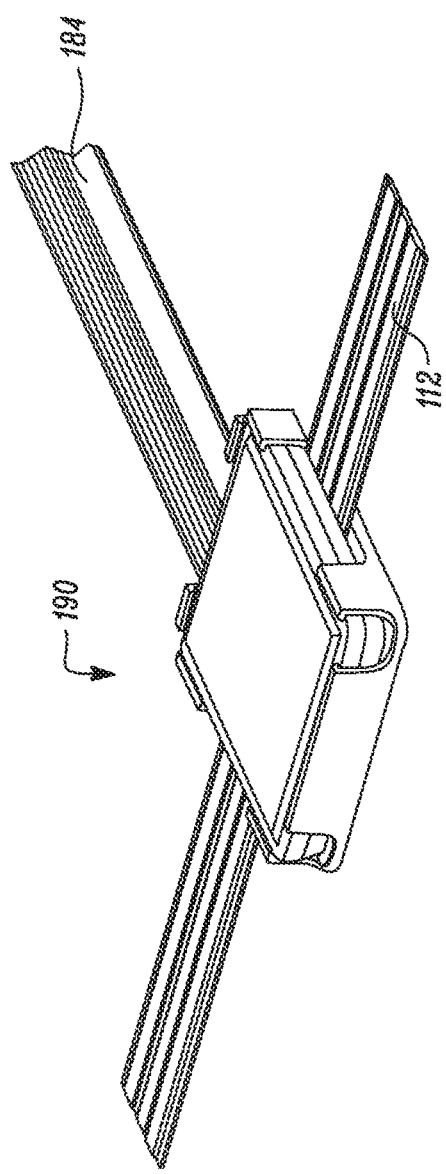

FIGS. 29-31 illustrate another embodiment of the backbone connector 190. FIGS. 29 and 30 show an exploded view of the backbone connector 190. Base plate 192 has pins 2912 to help align the connection between the backbone section 112 and umbilical cable 184. Base plate 192 also contains a snap feature 3012, preferably around the entire perimeter. Upper cover 2910 has alignment holes 2914, which are configured to accept pins 2912 from base plate 192. When assembled, as shown in FIG. 31, backbone connector 190 seals the PCBA 196 and windowed backbone 112 from the environment, including dust and water vapor. In certain embodiments, the assembled backbone connector 190 meets IP67 ingress protection. Upper cover 2910 may contain a conductive surface on the inside, such as a metal or conductive polymer coating. In other embodiments, the outside of the upper cover 2910 is the conductive surface or the upper cover 2910 is made from a conductive material, such as a metal, conductive polymer, or insulating material dispersed with metal particles (such as silver nanoparticles). In certain embodiments, upper cover 2910 is molded. Base plate 192 may also contain a conductive surface on the top side, such as a metal or conductive polymer coating. In other embodiments, the bottom of the base plate 192 is the conductive surface or the base plate 192 is made from a conductive material, such as a metal, conductive polymer, or insulating material dispersed with metal particles (such as silver nanoparticles). In certain embodiments, base plate 192 is molded. FIG. 31 shows the backbone connector 190 fully assembled connecting backbone section 112 to umbilical cable 184. In embodiments, the PCBA 196 routes data signals and the desired amount of voltage to the appropriate location and may contain active or passive electrical components (such as MOSFETS, resistors, op-amps, or microcontrollers)

The foregoing disclosure is not intended to limit the present disclosure to the precise forms or particular fields of use disclosed. As such, it is contemplated that various alternative embodiments and/or modifications to the present disclosure, whether explicitly described or implied herein, are possible in light of the disclosure. Having thus described embodiments of the present disclosure, a person of ordinary skill in the art will recognize that changes may be made in form and detail without departing from the scope of the present disclosure. For example, reference is made to "wire" or "wires," but a person of ordinary skill in the art will understand that in certain embodiments, one or more conductors (for example, metal without any insulation or outer sheathing) may be substituted. Thus, the present disclosure is limited only by the claims.

In the foregoing specification, the disclosure has been described with reference to specific embodiments. However, as one skilled in the art will appreciate, various embodiments disclosed herein can be modified or otherwise implemented in various other ways without departing from the spirit and scope of the disclosure. Accordingly, this description is to be considered as illustrative and is for the purpose of teaching those skilled in the art the manner of making and using various embodiments of the present disclosure. It is to be understood that the forms of disclosure herein shown and described are to be taken as representative embodiments. Equivalent elements, or materials may be substituted for those representatively illustrated and described herein. Moreover, certain features of the disclosure may be utilized independently of the use of other features, all as would be apparent to one skilled in the art after having the benefit of this description of the disclosure. Expressions such as "including", "comprising", "incorporating", "consisting of", "have", "is" used to describe and claim the present disclosure are intended to be construed in a non-exclusive manner, namely allowing for items, components or elements not explicitly described also to be present. Reference to the singular is also to be construed to relate to the plural.

Further, various embodiments disclosed herein are to be taken in the illustrative and explanatory sense, and should in no way be construed as limiting of the present disclosure. All joinder references (e.g., attached, affixed, coupled, connected, and the like) are only used to aid the reader's understanding of the present disclosure, and may not create limitations, particularly as to the position, orientation, or use of the systems and/or methods disclosed herein. Therefore, joinder references, if any, are to be construed broadly. Moreover, such joinder references do not necessarily infer that two elements are directly connected to each other.

Additionally, all numerical terms, such as, but not limited to, "first", "second", "third", "primary", "secondary", "main" or any other ordinary and/or numerical terms, should also be taken only as identifiers, to assist the reader's understanding of the various elements, embodiments, variations and/or modifications of the present disclosure, and may not create any limitations, particularly as to the order, or preference, of any element, embodiment, variation and/or modification relative to, or over, another element, embodiment, variation and/or modification.

It will also be appreciated that one or more of the elements depicted in the drawings/figures can also be implemented in a more separated or integrated manner, or even removed or rendered as inoperable in certain cases, as is useful in accordance with a particular application.

What is claimed is:

1. A backbone section comprising:
   an outer sheathing;
   a first conductor disposed within the outer sheathing;
   a second conductor disposed within the outer sheathing;
   a bus bar component disposed within the outer sheathing;
   a pair of inner sheathing members disposed within the outer sheathing and located on opposing sides of at least one of the first and second conductors; and
   a plurality of shield members disposed within the outer sheathing and located on opposing sides of at least one of the first and second conductors;
   wherein the first conductor is separated from the bus bar within the outer sheathing by at least an individual shield member of the plurality of shield members and at least an individual sheathing member of the pair of sheathing members.

2. The backbone section of claim 1, wherein the first conductor is adjacent to a first wall of the outer sheathing and the second conductor is adjacent to a second wall of the outer sheathing, the second wall opposite the first wall of the outer sheathing.

3. The backbone section of claim 1, wherein at least an individual shield member of the plurality of shield members is conductive.

4. The backbone section of claim 1, wherein the plurality of shield members contact each other on both sides of the first conductor or the second conductor and fully wraps around the first conductor or the second conductor.

5. The backbone section of claim 1, wherein the bus bar component is configured to transmit power and wherein the first conductor and the second conductor are configured to transfer data signals.

6. A backbone section comprising:
an outer sheathing; and
a plurality of stacked components disposed within the outer sheathing the plurality of stacked components comprising;
a first conductor;
a bus bar component; and
a first shield member,
wherein the first shield member is in direct contact with the bus bar; and
wherein the first shield member is located between the first conductor and the bus bar component within the plurality of stacked components.

7. The backbone section of claim 6, wherein the plurality of stacked components further comprises a second conductor wherein the first conductor is adjacent to a first wall of the outer sheathing and wherein and the second conductor is adjacent to a second wall of the outer sheathing, the second wall opposite the first wall of the outer sheathing.

8. The backbone section of claim 6, wherein the plurality of stacked components further comprises a second shield member, wherein the second shield member is opposite the first shield member in relation to the first conductor.

9. The backbone section of claim 6, wherein the bus bar component has a line impedance between 5 and 125 Ohms.

10. The backbone section of claim 6, wherein first shield member is conductive.

11. The backbone section of claim 6, wherein the bus bar component is configured solely to provide structural function to the backbone section.

12. The backbone section of claim 6, wherein the plurality of stacked components further comprises a first sheathing member and second sheathing member, wherein a thickness of the second sheathing member is greater than a thickness of the first sheathing member.

13. The backbone section of claim 6, wherein the bus bar component is configured to transmit power and wherein the first conductor is configured to transfer data signals.

14. A backbone section comprising:
an outer sheathing;
a pair of conductors disposed within the outer sheathing;
a bus bar component disposed within the outer sheathing;
an inner sheathing member disposed within the outer sheathing; and
a plurality of shield members disposed within the outer sheathing and located on opposing sides of at least one conductor of the pair of conductors;
wherein the pair of conductors is separated from the bus bar component within the outer sheathing by at least an individual shield member of the plurality of shield members and the inner sheathing member.

15. The backbone section of claim 14, wherein bus bar component is directly adjacent to the outer sheathing.

16. The backbone section of claim 14, wherein the pair of conductors comprises a first conductor and a second conductor and wherein the first conductor is adjacent to a first wall of the outer sheathing and the second conductor is adjacent to a second wall of the outer sheathing, the second wall opposite the first wall of the outer sheathing.

17. The backbone section of claim 14, wherein at least an individual shield member of the plurality of shield members is conductive.

18. The backbone section of claim 14, wherein the plurality of shield members contact each other on both sides of an individual conductor of the pair of conductors and fully wraps around an individual conductor of the pair of conductors.

19. The backbone section of claim 6, wherein the first shield member comprises a conductive portion and a non-conductive portion attached to the conductive portion.

* * * * *